United States Patent
Kihara et al.

(10) Patent No.: US 9,911,622 B2
(45) Date of Patent: *Mar. 6, 2018

(54) METHOD OF PROCESSING TARGET OBJECT

(71) Applicant: Tokyo Electron Limited, Tokyo (JP)

(72) Inventors: Yoshihide Kihara, Miyagi (JP); Toru Hisamatsu, Miyagi (JP); Tomoyuki Oishi, Miyagi (JP); Masanobu Honda, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/007,420

(22) Filed: Jan. 27, 2016

(65) Prior Publication Data

US 2016/0225639 A1 Aug. 4, 2016

(30) Foreign Application Priority Data

Jan. 30, 2015 (JP) .................................. 2015-016611

(51) Int. Cl.
H01L 21/311 (2006.01)
H01L 21/02 (2006.01)
(Continued)

(52) U.S. Cl.
CPC ...... *H01L 21/31144* (2013.01); *H01L 21/0228* (2013.01); *H01L 21/0276* (2013.01);
(Continued)

(58) Field of Classification Search
CPC ......... H01L 21/31144; H01L 21/31138; H01L 21/31116; H01L 21/02208; H01L 21/0276;
(Continued)

(56) References Cited

U.S. PATENT DOCUMENTS

2006/0281337 A1 12/2006 Matsuura
2010/0124618 A1* 5/2010 Kobayashi ............ C23C 16/345
427/535
2010/0255625 A1* 10/2010 De Vries ............. C23C 16/0245
438/57

FOREIGN PATENT DOCUMENTS

EP 3 007 205 A1 4/2016
JP 2011-082560 A 4/2011

OTHER PUBLICATIONS

Beynet, et al., "Low Temperature Plasma-Enhanced ALD Enables Cost-effective Spacer Defined Double Patterning (SDDP)", Downloaded from http://proceedings.spiedigitallibrary.org/ on Mar. 5, 2014.

(Continued)

*Primary Examiner* — Nadine Norton
*Assistant Examiner* — Mahmoud Dahimene
(74) *Attorney, Agent, or Firm* — Pearne & Gordon LLP

(57) ABSTRACT

Non-uniformity in a thickness of a silicon oxide film formed on a processing target object can be reduced even when an aspect ratio of an opening of a mask is increased. A silicon oxide film is formed by repeating a sequence including: (a) a first process of forming a reactant precursor on the processing target object by generating plasma of a first gas containing a silicon halide gas within a processing vessel of a plasma processing apparatus; (b) a second process of generating plasma of a rare gas within the processing vessel after the first process; (c) a third process of forming a silicon oxide film by generating plasma of a second gas containing an oxygen gas within the processing vessel after the second process; and (d) a fourth process of generating plasma of a rare gas within the processing vessel after the third process.

14 Claims, 15 Drawing Sheets

(51) Int. Cl.
*H01L 21/033* (2006.01)
*H01L 21/027* (2006.01)

(52) U.S. Cl.
CPC .. *H01L 21/02164* (2013.01); *H01L 21/02208* (2013.01); *H01L 21/02274* (2013.01); *H01L 21/0337* (2013.01); *H01L 21/31116* (2013.01); *H01L 21/31138* (2013.01)

(58) Field of Classification Search
CPC ......... H01L 21/02274; H01L 21/02164; H01L 21/0228; H01L 21/0337
See application file for complete search history.

(56) References Cited

OTHER PUBLICATIONS

Rowlette, et al., "Digital Control of SiO2 Film Deposition at Room Temperature", American Chemical Society, Department of Chemical Engineering, Colorado School of Mines, Colorado, Mar. 9, 2009.

\* cited by examiner

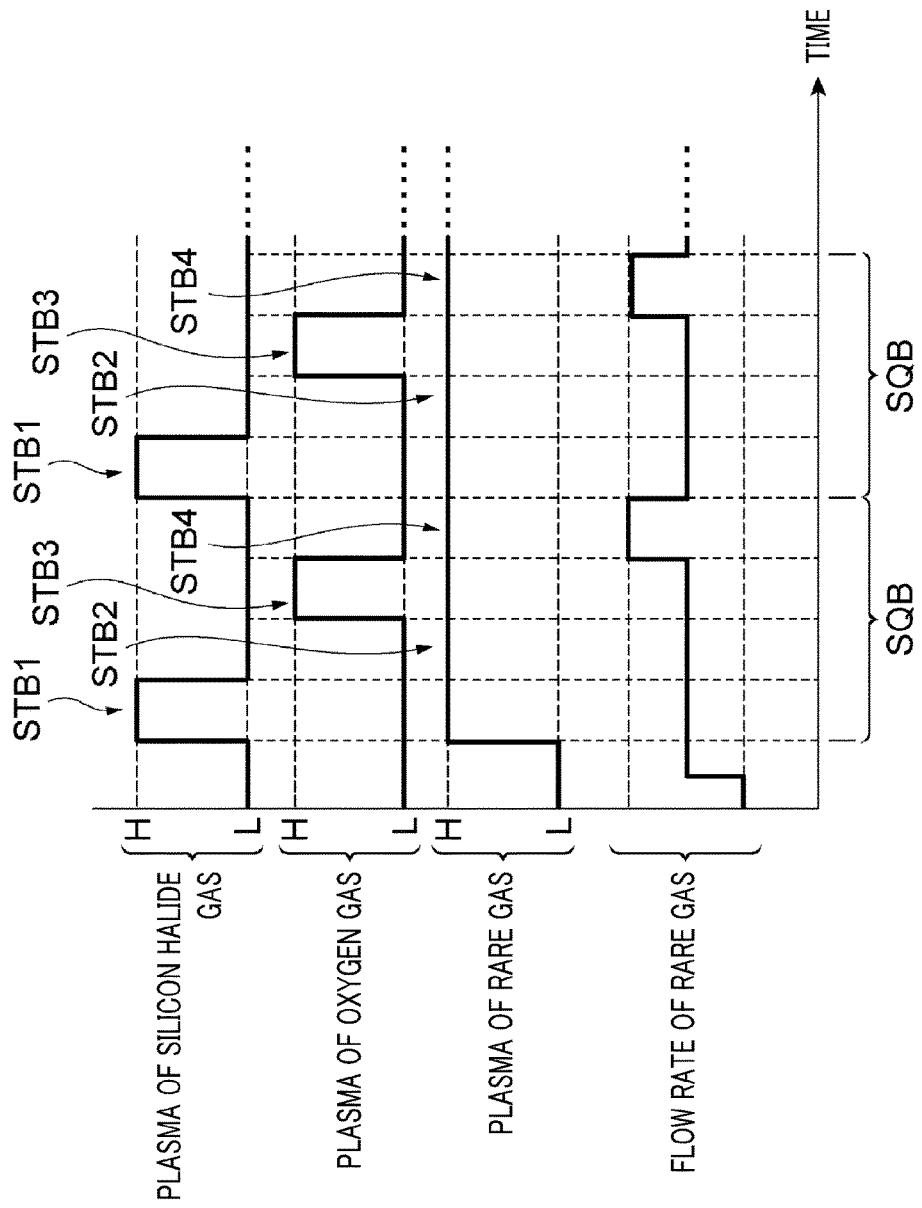

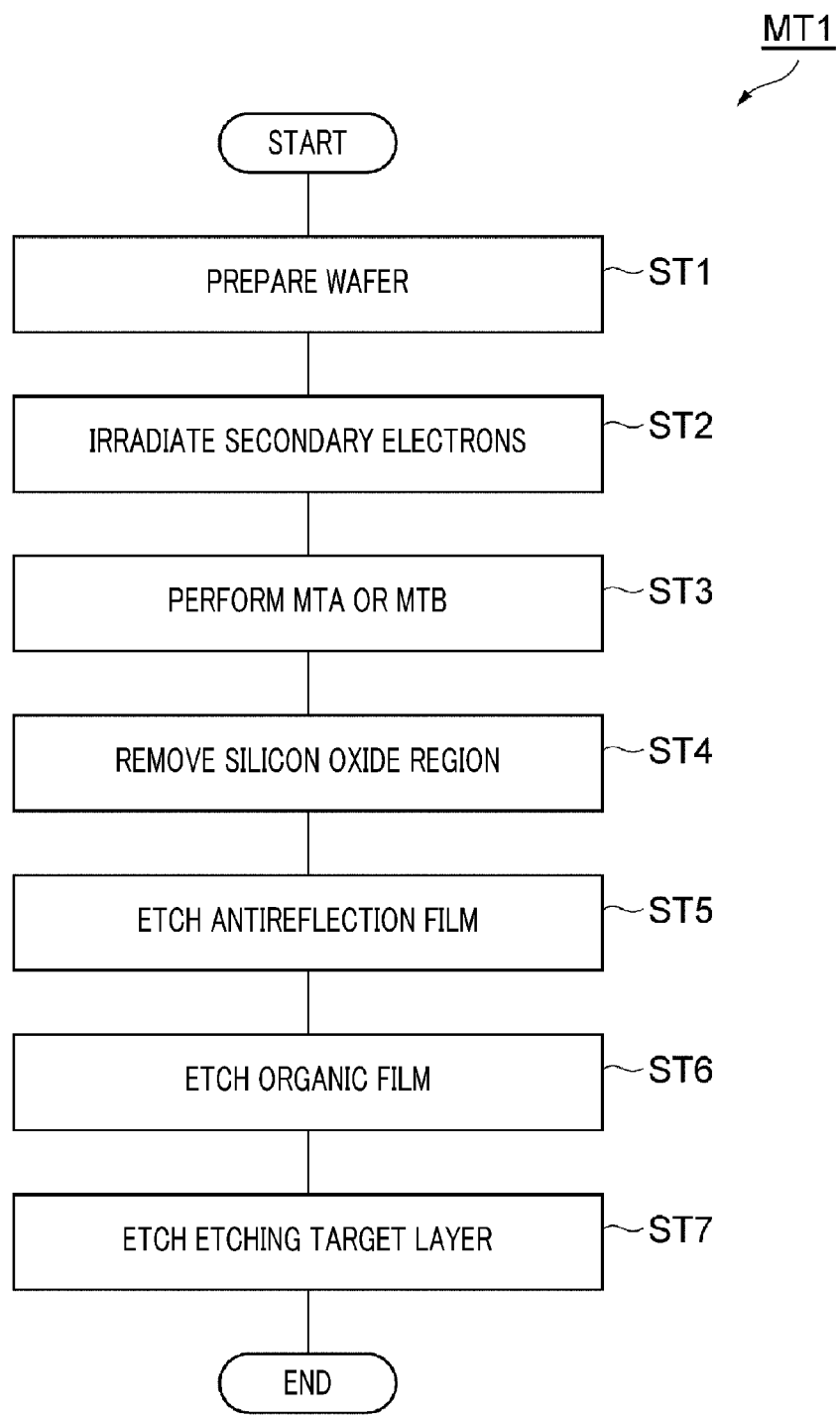

METHOD OF PROCESSING TARGET OBJECT

CROSS-REFERENCE TO RELATED APPLICATION

This application claims the benefit of Japanese Patent Application No. 2015-016611 filed on Jan. 30, 2015, the entire disclosures of which are incorporated herein by reference.

TECHNICAL FIELD

The embodiments described herein pertain generally to a method of processing a processing target object; and, more particularly, to a method including formation of a mask.

BACKGROUND

In a manufacturing process of an electronic device such as a semiconductor device, etching is performed to form a mask on an etching target layer and transcribe a pattern of the mask to the etching target layer. In general, a resist mask is used as the mask. The resist mask is formed by photolithography. Thus, a critical dimension of the pattern formed in the etching target layer is affected by a resolution limit of the resist mask formed by the photolithography.

With a recent trend of high integration of electronic devices, however, it is required to form a pattern having a dimension smaller than the resolution limit of the resist mask. In this regard, as described in Patent Document 1, there has been proposed a technique of reducing a width of an opening of the resist mask by depositing a silicon oxide film on the resist mask.

To be specific, in the technique disclosed in Patent Document 1, the silicon oxide film is formed on the resist mask by an atomic layer deposition (ALD) method. More specifically, a source gas containing organic silicon and activated oxygen species are alternately supplied into a processing vessel in which a processing target object is accommodated. An aminosilane gas is used as the source gas.

Patent Document 1: Japanese Patent Laid-open Publication No. 2011-082560

In the technique of reducing the opening width of the mask by using the silicon oxide film, which is formed on a surface of the processing target object including a surface of the mask by using the film forming method such as the ALD method, non-uniformity in thicknesses of the silicon oxide film at individual positions on the surface of the processing target object needs to be reduced. That is, when forming the silicon oxide film, the silicon oxide film needs to have high in-plane uniformity on the surface of the processing target object and, also, to have conformal coatability. Here, the term "conformal coatability" implies that a difference between a thickness of the silicon oxide film on a top surface of the mask, a thickness (width) of the silicon oxide film on a side surface of the mask confining the opening and a thickness of the silicon oxide film on a bottom surface of the opening is small. If, however, an aspect ratio of the opening of the mask is increased, the thickness of the silicon oxide film on the side surface of the mask confining the opening and the thickness of the silicon oxide film on the bottom surface of the opening are reduced as compared to the thickness of the silicon oxide film formed on the top surface of the mask.

Accordingly, it is required to reduce the non-uniformity in the thickness of the silicon oxide film formed on the processing target object even when the aspect ratio of the opening of the mask is increased.

SUMMARY

In view of the foregoing, exemplary embodiments provide a wiring layer forming method, a wiring layer formation system and a recording medium, capable of eliminating a seed layer and a barrier layer located outside a wiring layer on a surface of a substrate after forming the wiring layer within a recess of the substrate.

In one exemplary embodiment, there is provided a method of processing a processing target object having a mask. The method includes forming a silicon oxide film by repeating a sequence including: (a) a first process of forming a reactant precursor on the processing target object by generating plasma of a first gas containing a silicon halide gas within a processing vessel of a plasma processing apparatus; (b) a second process of generating plasma of a rare gas within the processing vessel after the first process; (c) a third process of forming a silicon oxide film by generating plasma of a second gas containing an oxygen gas within the processing vessel after the second process; and (d) a fourth process of generating plasma of a rare gas within the processing vessel after the third process.

In this method, a silicon-containing precursor is formed on the processing target object in the first process of the sequence, and the precursor is oxidized in the third process of the sequence. Accordingly, according to this method, the silicon oxide film having a thickness determined by the repetition number of the sequence is formed on the processing target object. Thus, according to the method, it is possible to adjust an opening width of a mask to a desired size.

Further, according to the method, a bond on a surface of the precursor is activated by active species of atoms of the rare gas in the second process between the first process and the third process. Further, a bond on a surface of the silicon oxide film is activated in the fourth process. Accordingly, oxygen deficiency in a Si—O network in the silicon oxide film can be suppressed. Thus the formed silicon oxide film can be highly densified. That is, the silicon oxide film having a high density and a thin thickness can be conformally formed on a surface of the processing target object through a single sequence. By repeating this sequence, it is possible to form the silicon oxide film having high in-plane uniformity and conformal coatability on the surface of the processing target object even when the processing target object has a mask provided with an opening having a high aspect ratio. That is, non-uniformity in the thickness of the silicon oxide film formed on the surface of the processing target object can be reduced.

Furthermore, the silicon halide gas such as, but not limited to, a $SiCl_4$ gas, a $SiBr_4$ gas, a $SiF_4$ gas or a $SiH_2Cl_4$ gas is in a vaporized state at a room temperature. Accordingly, according to the method of the exemplary embodiment, it is possible to form the silicon-containing precursor on the processing target object at a low temperature without needing to use a dedicated film forming apparatus having a vaporizer.

The first process, the second process, the third process and the fourth process may be consecutively performed in order, and the plasma of the rare gas may be generated throughout the first process, the second process, the third process and the fourth process. According to this exemplary embodiment, a process of purging a space within the processing vessel need not be performed between the first process and the third process, and between the third process and a next first process. Furthermore, a time period for plasma stabilization need not be secured, either. Therefore, the throughput can be improved.

A flow rate of the rare gas supplied into the processing vessel in the fourth process may be higher than a flow rate of the rare gas supplied into the processing vessel in the third process. In this exemplary embodiment, an oxygen gas used in the third process can be rapidly exhausted from the space within the processing vessel. Thus, the throughput can be further improved. The flow rate of the rare gas supplied into the processing vessel in the fourth process may be five or more times as high as the flow rate of the rare gas supplied into the processing vessel in the third process. By using the rare gas in this flow rate range in the fourth process, the oxygen gas used in the third process can be more rapidly exhausted from the processing vessel.

The method may further include purging a space within the processing vessel between the first process and the second process; purging the space within the processing vessel between the second process and the third process; purging the space within the processing vessel between the third process and the fourth process; purging the space within the processing vessel between the fourth process and the first process. In the purging processes, the "purging" is performed to substitute the gas within the processing vessel in order to suppress the silicon halide gas and the oxygen gas from being provided together within the processing vessel. Here, either gas purging of supplying an inert gas into the processing vessel or purging by vacuum evacuation, or both of the gas purging and the purging by the vacuum evacuation may be performed.

The first process may be performed under a high-pressure and low-power condition where an internal pressure of the processing vessel is equal to or higher than 13.33 Pa and a power of a high frequency power for plasma generation is equal to or lower than 100 W. By generating the plasma under this high-pressure and low-power condition, excessive generation of active species of halogen atoms can be suppressed. Accordingly, damage on the mask and/or damage on a previously formed silicon oxide film can be suppressed. Moreover, it is also possible to reduce non-uniformity in the thickness of the silicon oxide film on the processing target object. In addition, even if there is a dense region in which the mask is densely formed and a sparse region in which the mask is sparsely formed, that is, even if the mask has a densely patterned region and a sparsely patterned region, it is possible to reduce a difference in thicknesses of the silicon oxide film on these two regions.

A bias power for ion attraction may not be applied to a mounting table configured to mount thereon the processing target object in the first process. According to this exemplary embodiment, as for the mask having protrusions and depressions, uniformity in the thickness of the silicon oxide film formed on a top surface and a side surface of the mask and on a surface of a base of the mask can be further improved.

The processing target object may further include an etching target layer, an organic film on the etching target layer, and a silicon-containing antireflection film on the organic film. The mask may be a resist mask formed on the antireflection film. The method may further include (e) removing, after performing the sequence, a region made of silicon oxide on a surface of the antireflection film by plasma generated within the processing vessel; (f) etching the antireflection film by plasma generated within the processing vessel; and (g) etching the organic film by plasma generated within the processing vessel. According to this exemplary embodiment, the silicon oxide film is formed on a surface of the processing target object including a surface of the resist mask, and an opening width of the resist mask is adjusted. Then, a region made of the silicon oxide on the antireflection film is removed. Thereafter, by etching the antireflection film and the organic film, a mask for etching the etching target layer is obtained.

The plasma processing apparatus may be configured as a capacitively coupled plasma processing apparatus, and the method may further comprise, before performing the sequence, irradiating secondary electrons to the mask by generating plasma within the processing vessel and by applying a negative DC voltage to an upper electrode of the plasma processing apparatus. According to this exemplary embodiment, by modifying the resist mask, a damage on the resist mask caused by a subsequent process can be suppressed.

The processing target object may further include an etching target layer and an organic film on the etching target layer. The mask may be formed on the organic film. The method may further include (h) etching an antireflection film having thereon a resist mask by plasma generated within the processing vessel to form the mask from the antireflection film; and (i) etching the organic film by plasma generated within the processing vessel. Further, the sequence is performed between the etching of the antireflection film and the etching of the organic film, and the method may further include removing, after performing the sequence, a region made of silicon oxide on a surface of the organic film by plasma generated within the processing vessel. According to this exemplary embodiment, the silicon oxide film is formed on a surface of the processing target object including the mask formed from the antireflection film. Then, after an opening width of the mask is adjusted, the region made of the silicon oxide film on the organic film is removed. Then, by etching the organic film, a mask for etching the processing target object is obtained.

The plasma processing apparatus may be configured as a capacitively coupled plasma processing apparatus, and the method may further comprise, before the etching of the antireflection film, irradiating secondary electrons to the resist mask by generating plasma within the processing vessel and applying a negative DC voltage to an upper electrode of the plasma processing apparatus. According to this exemplary embodiment, by modifying the resist mask, a damage on the resist mask caused by a subsequent process can be suppressed.

The method may further include forming a protective film made of silicon oxide on the processing target object after the etching of the antireflection film and before performing the sequence. According to this exemplary embodiment, it is possible to protect the organic film from the plasma of the oxygen gas generated in the third process.

The plasma processing apparatus may be configured as a capacitively coupled plasma processing apparatus, and in the forming of the protective film made of the silicon oxide, plasma may be generated within the processing vessel and a negative DC voltage may be applied to an upper electrode, which is made of silicon, of the plasma processing apparatus. In this exemplary embodiment, silicon is emitted from the upper electrode. Further, oxygen is emitted from components exposed to the plasma within the processing vessel. As the emitted silicon and oxygen bonds with each other, the protective film made of the silicon oxide is formed.

In the forming of the protective film made of the silicon oxide, plasma of a mixed gas containing the silicon halide gas and the oxygen gas may be generated within the processing vessel. According to this exemplary embodiment, the protective film made of the silicon oxide is formed by a plasma CVD method.

The plasma processing apparatus may be configured as a capacitively coupled plasma processing apparatus, and in the forming of the protective film made of the silicon oxide, plasma of a mixed gas containing a hydrogen gas and a rare gas may be generated by supplying a high frequency power for plasma generation to an upper electrode, which is made of silicon oxide, of the plasma processing apparatus. In this exemplary embodiment, the protective film is formed of the silicon oxide emitted from the upper electrode.

As stated above, according to the exemplary embodiments, it is possible to reduce non-uniformity in the thickness of the silicon oxide film formed on the processing target object even when the opening of the mask has a high aspect ratio.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 6 is timing charts regarding generation of plasma and a flow rate of a rare gas in the method shown in FIG. 5;

FIG. 7 is a flowchart for describing an example method of processing a processing target object including the method shown in FIG. 1 or the method shown in FIG. 5;

DETAILED DESCRIPTION

Figure 1:
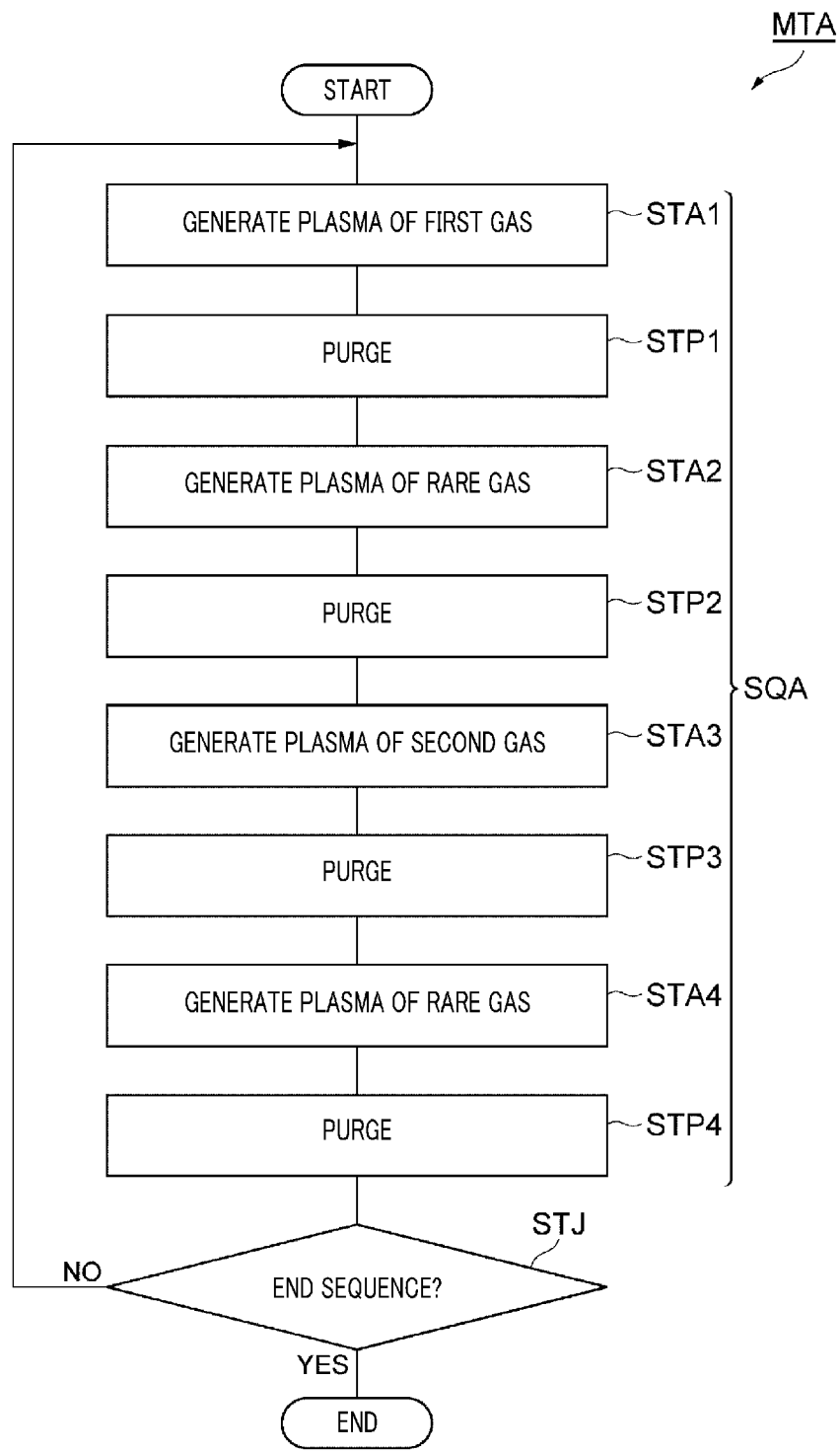
FIG. 1 is a flowchart for describing a method of processing a processing target object according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

FIG. 1 is a flowchart for describing a method of processing a processing target object according to an exemplary embodiment. The method MTA described in FIG. 1 is a method of reducing an opening width of a resist mask of a processing target object (hereinafter, sometimes referred to as "wafer W"). In the method MTA according to the exemplary embodiment, a series of processes can be performed in a single plasma processing apparatus.

Figure 2:
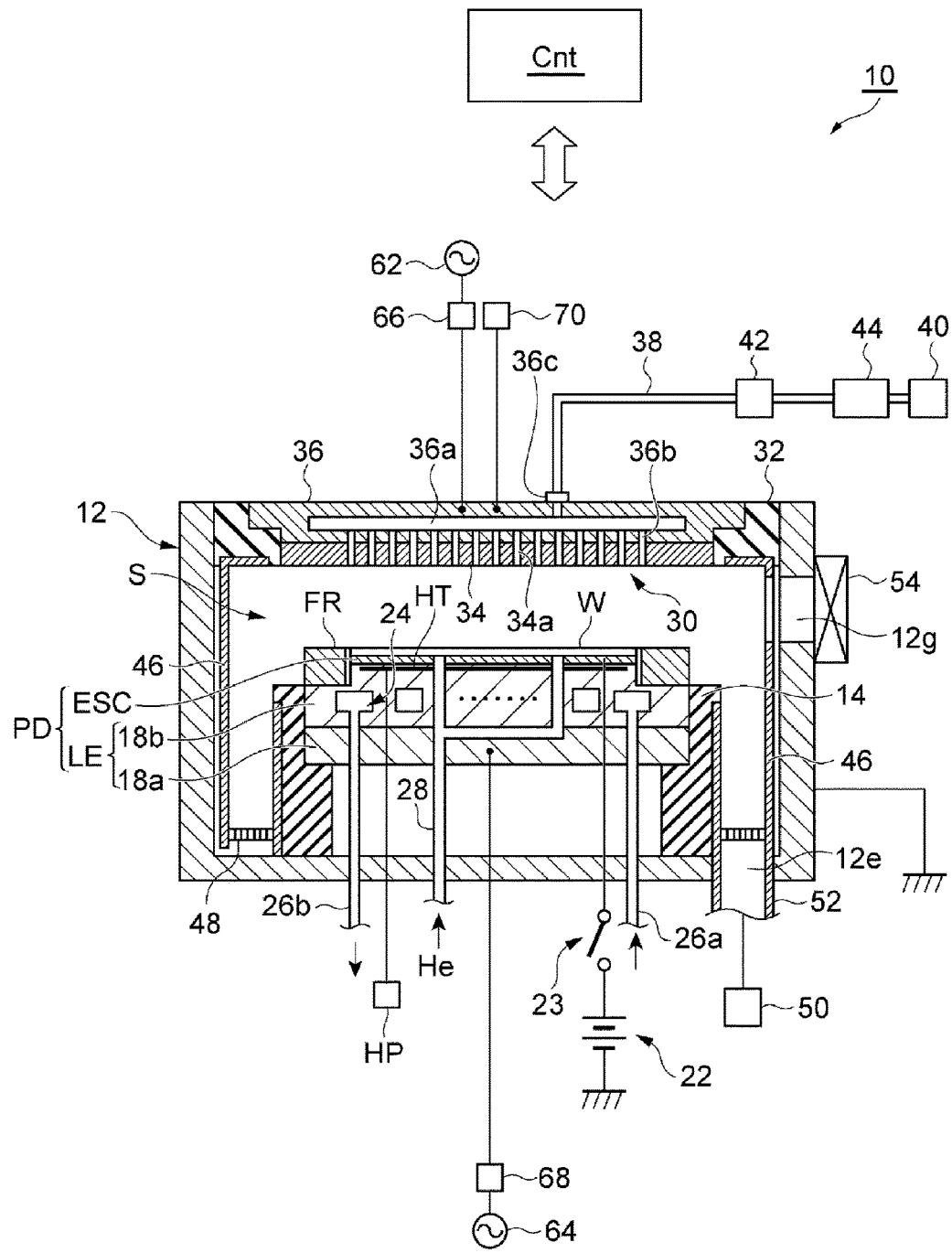
FIG. 2 is a diagram illustrating an example of a plasma processing apparatus.

FIG. 2 is a diagram illustrating an example of a plasma processing apparatus. FIG. 2 schematically depicts a cross sectional view of the plasma processing apparatus 10 in which various methods of processing the processing target object according to the various exemplary embodiments are performed. As depicted in FIG. 2, the plasma processing apparatus 10 is configured as a capacitively coupled plasma etching apparatus, and includes a processing vessel 12. The processing vessel 12 has a substantially cylindrical shape. The processing vessel 12 is made of, but not limited to, aluminum, and an inner wall surface thereof is anodically oxidized. This processing vessel 12 is frame-grounded.

A substantially cylindrical supporting member 14 is provided on a bottom portion of the processing vessel 12. The supporting member 14 is made of, by way of non-limiting example, an insulating material containing oxygen such as quartz. Within the processing vessel 12, the supporting member 14 is vertically extended from the bottom portion of the processing vessel 12. Furthermore, a mounting table PD is provided within the processing vessel 12. The mounting table PD is supported by the supporting member 14.

The mounting table PD is configured to hold a wafer W on a top surface thereof. The mounting table PD has a lower electrode LE and an electrostatic chuck ESC. The lower electrode LE is provided with a first plate 18a and a second plate 18b. The first plate 18a and the second plate 18b are made of a metal such as, but not limited to, aluminum, and each thereof has a substantially disk shape. The second plate 18b is provided on the first plate 18a and electrically connected with the first plate 18a.

The electrostatic chuck ESC is provided on the second plate 18b. The electrostatic chuck ESC includes a pair of insulating films or insulating sheets; and an electrode embedded therebetween. The electrode of the electrostatic chuck ESC is electrically connected to a DC power supply 22 via a switch 23. The electrostatic chuck ESC is configured to attract the wafer W by an electrostatic force such as a Coulomb force generated by a DC voltage applied from the DC power supply 22. Accordingly, the electrostatic chuck ESC is capable of holding the wafer W thereon.

A focus ring FR is provided on a peripheral portion of the second plate 18b to surround an edge of the wafer W and the electrostatic chuck ESC. The focus ring FR is provided to improve etching uniformity. The focus ring FR is made of a material which is appropriately selected depending on a material of an etching target film. For example, the focus ring FR may be made of quartz.

A coolant path 24 is provided within the second plate 18b. The coolant path 24 constitutes a temperature controller. A coolant is supplied into the coolant path 24 from a chiller unit provided outside the processing vessel 12 via a pipeline 26a. The coolant supplied into the coolant path 24 is then returned back into the chiller unit via a pipeline 26b. In this way, the coolant is supplied into and circulated through the coolant path 24. A temperature of the wafer W held by the electrostatic chuck ESC is controlled by adjusting a temperature of the coolant.

Furthermore, the plasma processing apparatus 10 is provided with a gas supply line 28. The gas supply line 28 supplies a heat transfer gas, e.g., a He gas, from a heat transfer gas supply device into a gap between a top surface of the electrostatic chuck ESC and a rear surface of the wafer W.

The plasma processing apparatus 10 is also equipped with a heater HT as a heating device. The heater HT is embedded in, for example, the second plate 18b, and is connected to a heater power supply HP. As a power is supplied to the heater HT from the heater power supply HP, the temperature of the mounting table PD is adjusted, and, thus, the temperature of the wafer W placed on the mounting table PD can be adjusted. Alternatively, the heater HT may be embedded in the electrostatic chuck ESC.

Further, the plasma processing apparatus 10 includes an upper electrode 30. The upper electrode 30 is provided above the mounting table PD, facing the mounting table PD. The lower electrode LE and the upper electrode 30 are arranged to be substantially parallel to each other. Provided between the upper electrode 30 and the lower electrode LE is a processing space S in which a plasma process is performed on the wafer W.

The upper electrode 30 is supported at an upper portion of the processing vessel 12 with an insulating shield member 32 therebetween. The insulating shield member 32 is made of an insulating material containing oxygen such as quartz. The upper electrode 30 may include an electrode plate 34 and an electrode supporting body 36. The electrode plate 34 faces the processing space S and is provided with a multiple number of gas discharge holes 34a. In the exemplary embodiment, the electrode plate 34 is made of silicon. Alternatively, in another exemplary embodiment, the electrode 34 may be made of silicon oxide.

The electrode supporting body 36 is configured to support the electrode plate 34 in a detachable manner, and is made of a conductive material such as, but not limited to, aluminum. The electrode supporting body 36 may have a water-cooling structure. A gas diffusion space 36a is formed within the electrode supporting body 36. A multiple number of gas through holes 36b is extended downwards from the gas diffusion space 36a, and these gas through holes 36b respectively communicate with the gas discharge holes 34a. Further, the electrode supporting body 36 is also provided with a gas inlet opening 36c through which a processing gas is introduced into the gas diffusion space 36a, and this gas inlet opening 36c is connected to a gas supply line 38.

The gas supply line 38 is connected to a gas source group 40 via a valve group 42 and a flow rate controller group 44. The gas source group 40 includes a plurality of gas sources. The gases sources may include a source of a silicon halide gas, a source of an oxygen gas, a source of a nitrogen gas, a source of a fluorocarbon gas, a source of a rare gas, and a source of an inert gas. The silicon halide gas may be, for example, a $SiCl_4$ gas. Alternatively, the silicon halide gas may be, for example, a $SiBr_4$ gas, a $SiF_4$ gas or a $SiH_2Cl_4$ gas. Further, the fluorocarbon gas may be a $CF_4$ gas, a $C_4F_6$ gas or a $C_4F_8$ gas. The rare gas may be, for example, a He gas or an Ar gas. In addition, the inert gas may be, but not limited to, a nitrogen gas.

The valve group 42 includes a multiplicity of valves, and the flow rate controller group 44 includes multiple flow rate controllers such as mass flow controller. Each of the gas sources belonging to the gas source group 40 is connected to the gas supply line 38 via each corresponding valve belonging to the valve group 42 and each corresponding flow rate controller belonging to the flow rate controller group 44. Accordingly, the plasma processing apparatus 10 is capable of supplying gases from one or more gas sources selected from the plurality of gas sources belonging to the gas source group 40 into the processing vessel 12 while controlling flow rates of the gases individually.

Furthermore, in the plasma processing apparatus 10, a deposition shield 46 is detachably provided along an inner wall of the processing vessel 12. The deposition shield 46 is also provided on an outer side surface of the supporting member 14. The deposition shield 46 is configured to suppress an etching byproduct (deposit) from adhering to the processing vessel 12, and is formed by coating an aluminum member with ceramics such as $Y_2O_3$. Here, besides the $Y_2O_3$, the deposition shield may also be made of an oxygen-containing material such as quartz.

A gas exhaust plate 48 is provided at a bottom portion of the processing vessel 12 and provided between the supporting member 14 and the inner wall of the processing vessel 12. The gas exhaust plate 48 may be made of, by way of example, an aluminum member coated with ceramic such as $Y_2O_3$. The processing vessel 12 is also provided with a gas exhaust opening 12e under the gas exhaust plate 48, and the gas exhaust opening 12e is connected with a gas exhaust device 50 via a gas exhaust line 52. The gas exhaust device 50 includes a vacuum pump such as a turbo molecular pump and is capable of depressurizing the inside of the processing vessel 12 to a desired vacuum level. Further, a carry-in/out opening 12g for the wafer W is formed through a sidewall of the processing vessel 12, and this carry-in/out opening 12g is opened or closed by a gate valve 54.

The plasma processing apparatus 10 further includes a first high frequency power supply 62 and a second high frequency power supply 64. The first high frequency power supply 62 is configured to generate a first high frequency power for plasma generation. That is, the first high frequency power supply 62 generates a high frequency power having a frequency in a range from 27 MHz to 100 MHz, e.g., 40 MHz. The first high frequency power supply 62 is connected to the upper electrode 30 via a matching device 66. The matching device 66 is a circuit for matching an output impedance of the first high frequency power supply 62 and an input impedance on a load side (lower electrode LE). Furthermore, the first high frequency power supply 62 may be connected to the lower electrode LE via the matching device 66.

The second high frequency power supply 64 is configured to generate a second high frequency power for ion attraction into the wafer W, i.e., a high frequency bias power having a frequency in a range from 400 kHz to 13.56 MHz, e.g., 3.2 MHz. The second high frequency power supply 64 is connected to the lower electrode LE via a matching device 68. The matching device 68 is a circuit for matching an output impedance of the second high frequency power supply 64 and the input impedance on the load side (lower electrode LE).

The plasma processing apparatus 10 further includes a power supply 70. The power supply 70 is connected to the upper electrode 30. The power supply 70 is configured to apply, to the upper electrode 30, a voltage for attracting positive ions existing within the processing space S to the electrode plate 34. In the exemplary embodiment, the power supply 70 is a DC power supply configured to generate a negative DC voltage. If such a voltage is applied from the power supply 70 to the upper electrode 30, the positive ions existing within the processing space S collide with the electrode plate 34. As a result, secondary electrons and/or silicon are emitted from the electrode plate 34.

Furthermore, according to the exemplary embodiment, the plasma processing apparatus 10 further includes a controller Cnt. The controller Cnt is a computer including a processor, a memory unit, an input device, a display device, and so forth, and is configured to control individual components of the plasma processing apparatus 10. To be specific, the controller Cnt is connected to the valve group 42, the flow rate controller group 44, the gas exhaust device 50, the first high frequency power supply 62, the matching device 66, the second high frequency power supply 64, the matching device 68, the power supply 70, the heater power supply HP and the chiller unit.

The controller Cnt is operated according to a program based on inputted recipes, and sends control signals. In response to the control signals from the controller Cnt, selection of a gas supplied from the gas source group and a flow rate of the selected gas, a gas exhaust by the gas exhaust device 50, power supplies from the first and second high frequency power supplies 62 and 64, a voltage application from the power supply 70, a power supply from the heater power supply HP, a flow rate and a temperature of a coolant from the chiller unit can be controlled. Further, individual processes of the method of processing the processing target object described in the present disclosure can be implemented by operating the individual components of the plasma processing apparatus 10 under the control of the controller Cnt.

Referring back to FIG. 1, the method MTA will be elaborated. An example case where the plasma processing apparatus 10 is used to perform the method MTA will be described. In the following description, reference is made to FIG. 3A to FIG. 3F and FIG. 4. FIG. 3A to FIG. 3F are cross sectional views illustrating an initial state of a processing target object and states of the processing target object after individual processes shown in FIG. 1 are performed. FIG. 4 presents timing charts regarding generation of plasma and purge in the method shown in FIG. 1. Specifically, FIG. 4 provides timing charts regarding plasma of a silicon halide gas, plasma of an oxygen gas and plasma of a rare gas. On each timing chart of FIG. 4, a high level (indicated by "H" in the drawing) represents a state where the plasma of each gas is generated, and a low level (indicated by "L" in the drawing) represents a state where the plasma of each gas is not generated. Further, FIG. 4 also provides a timing chart for the purge. On the timing chart for the purge, a high level (indicated by "H" in the drawing) represents a state where the purge is being performed, and a low level (indicated by "L" in the drawing) represents a state where the purge is not being performed.

Figure 3A:
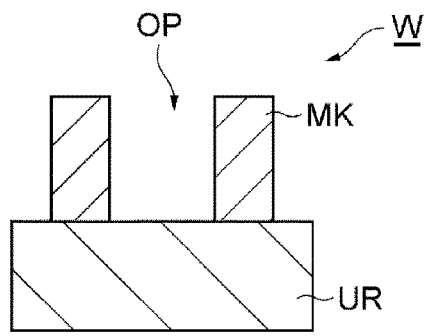
FIG. 3A to FIG. 3F are cross sectional views illustrating an initial state of the processing target object and states of the processing target object after individual processes of the method shown in FIG. 1 are performed.
Figure 4:
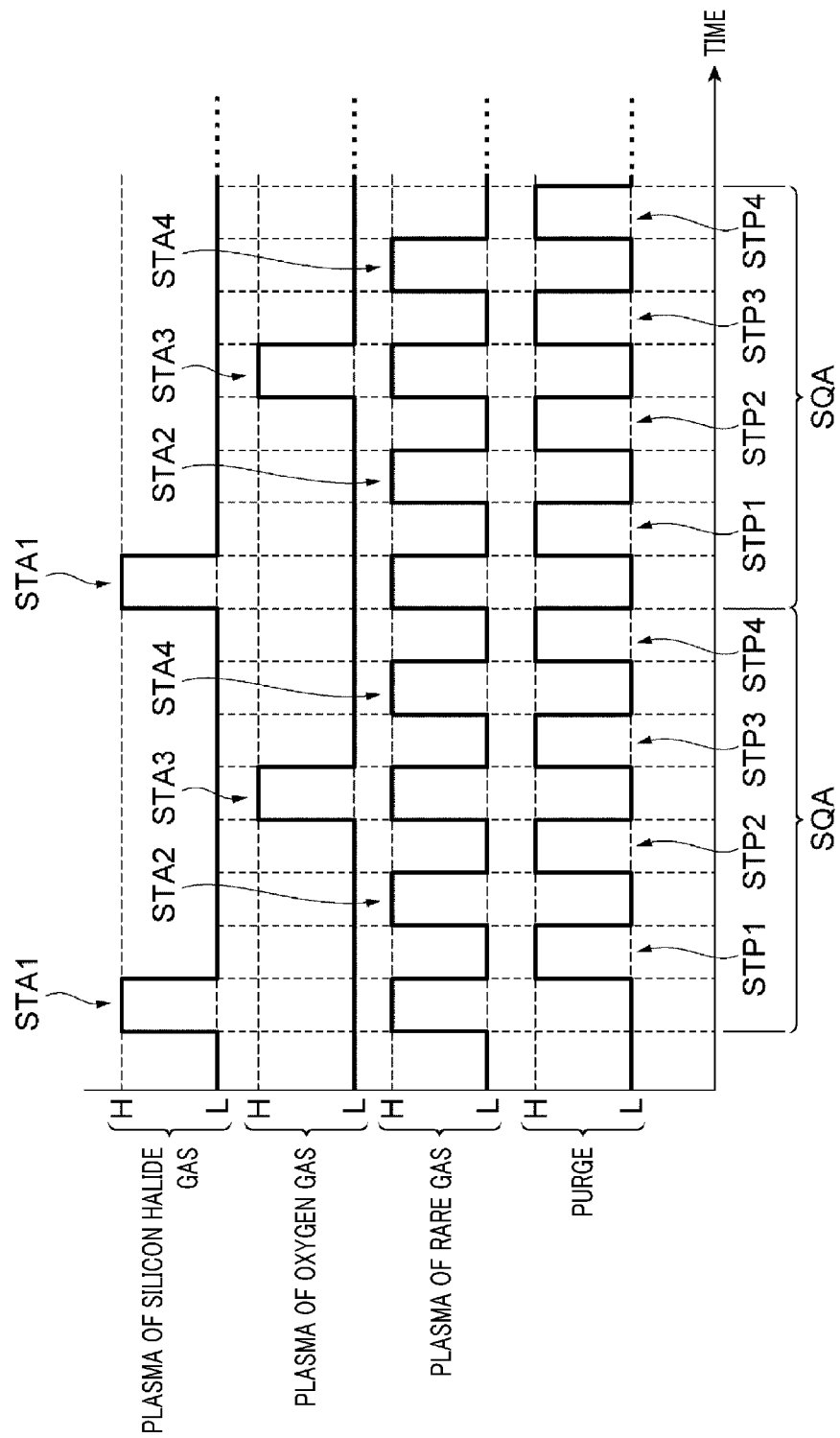
FIG. 4 provides timing charts regarding generation of plasma and purge in the method shown in FIG. 1.

In the method MTA shown in FIG. 1, a wafer W depicted in FIG. 3A is first prepared. The wafer W includes an underlying region UR and a mask MK. The underlying region UR is a base of the mask MK and includes an etching target layer. In the method MTA, the wafer W is accommodated in the processing vessel 12 of the plasma processing apparatus 10 and mounted on the mounting table PD.

In the method MTA, a sequence SQA is repeatedly performed. The sequence SQA includes a process STA1, a process STA2, a process STA3 and a process STA4. The sequence SQA further includes processes STP1, STP2, STP3 and STP4 where purge is performed.

As depicted in FIG. 1, in the process STA1, plasma of a first gas containing a silicon halide gas is generated within the processing vessel 12. In this exemplary embodiment, the first gas contains the silicon halide gas and a rare gas. In the process STA1, the plasma of the silicon halide gas and plasma of the rare gas are generated, as shown in FIG. 4. To elaborate, in the process STA1, the halogenide silicon gas and the rare gas are supplied into the processing vessel 12 from gas sources selected from the plurality of gas sources belonging to the gas source group 40. Further, a high frequency power is supplied from the first high frequency power supply 62. Furthermore, by operating the gas exhaust device 50, an internal pressure of a space within the processing vessel 12 is set to a preset value. As a result, the plasma of the first gas is generated. The first gas contains, by way of example, but not limitation, a $SiCl_4$ gas as the silicon halide gas. Further, the first gas may further contain the rare gas such as, but not limited to, an Ar gas or a He gas. Furthermore, the first gas may contain a $SiBr_4$ gas, a $SiF_4$ gas or a $SiH_2Cl_4$ gas as the silicon halide gas.

Figure 3B:
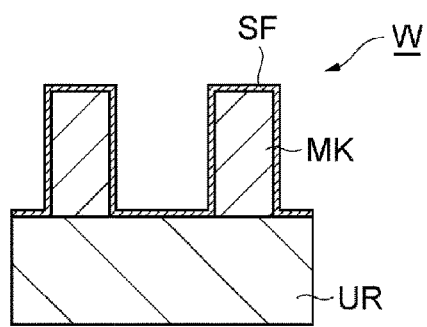

Once the plasma of the first gas is generated in the process STA1, a reactant precursor such as dissociated species of the silicon halogenide contained in the first gas is generated. The generated precursor adheres to the wafer W to form a silicon-containing film SF on a surface of the wafer W, as shown in FIG. 3B.

As depicted in FIG. 1 and FIG. 4, in the process STP1, the space within the processing vessel 12 is purged. To be specific, the first gas supplied in the process STA1 is exhausted. In the process STP1, the inert gas such as a nitrogen gas may be supplied into the processing vessel of the plasma processing apparatus as a purge gas. That is, in the process STP1, either the gas purging of supplying the inert gas into the processing vessel or the purging by vacuum evacuation, or both of the gas purging and the purging by the vacuum evacuation may be performed. In the process STP1, the precursor excessively attached to the wafer W is also removed.

Subsequently, in the process STA2, plasma of a rare gas such as an Ar gas or a He gas is generated within the processing vessel 12. Specifically, the rare gas is supplied into the processing vessel 12 from the gas source selected from the plurality of gas sources belonging to the gas source group 40. Further, the high frequency power is supplied from the first high frequency power supply 62. Furthermore, by operating the gas exhaust device 50, the internal pressure of the space within the processing vessel 12 is set to a preset value. As a result, the plasma of the rare gas is generated. In the subsequence process STP2, the space within the processing vessel 12 is purged in the same manner as the process STP1.

Then, in the process STA3, plasma of a second gas containing an oxygen gas is generated within the processing vessel 12. In the present exemplary embodiment, the second gas contains, in addition to the oxygen gas, a rare gas such as an Ar gas or a He gas. In the process STA3, plasma of the oxygen gas and plasma of the rare gas are generated, as depicted in FIG. 4. To elaborate, the second gas is supplied into the processing vessel 12 from the gas sources selected from the plurality of gas sources belonging to the gas source group 40. Further, the high frequency power is supplied from the first high frequency power supply 62. Furthermore, by operating the gas exhaust device 50, the internal pressure of the space within the processing vessel 12 is set to a preset value.

Figure 3C:
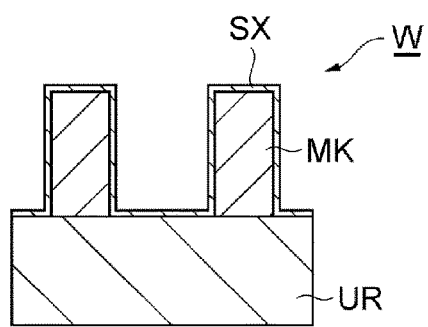

The precursor in the silicon-containing film SF formed in the above-described process STA1 includes a bond between silicon and halogen atom, for example, a bond between silicon and chlorine. Binding energy between the silicon and the halogen atom is lower than binding energy between silicon and oxygen. Accordingly, by performing the process STA3, the halogen atom in the silicon-containing film SF is substituted with oxygen. As a consequence, a silicon oxide film SX is formed on the surface of the wafer W, as depicted in FIG. 3C.

Subsequently, in the process STP3, the space within the processing vessel 12 is purged in the same manner as the processes STP1 and STP2. Then, in the process STA4, plasma of a rare gas is generated within the processing vessel 12, the same as in the process STA2. Afterwards, in the process STP4, the space within the processing vessel 12 is purged in the same manner as the processes STP1, STP2 and STP3.

Thereafter, in a process STJ, it is determined whether to end the repetition of the sequence SQA. To elaborate, in the process STJ, it is determined whether the repetition number of the sequence SQA has reached a predetermined value. The repetition number of the sequence SQA decides a thickness of the silicon oxide film SX formed on the surface of the wafer W. That is, the thickness of the silicon oxide film SX finally formed on the surface of the wafer W is determined substantially by multiplying a thickness of the silicon oxide film formed through the single sequence SQA by the repetition number thereof. Accordingly, the repetition number of the sequence SQA is set based on a required thickness of the silicon oxide film to be formed on the surface of the wafer W.

Figure 3D:
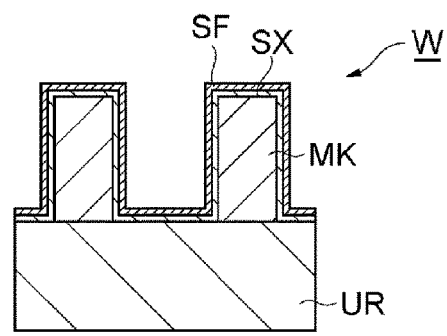
Figure 3E:
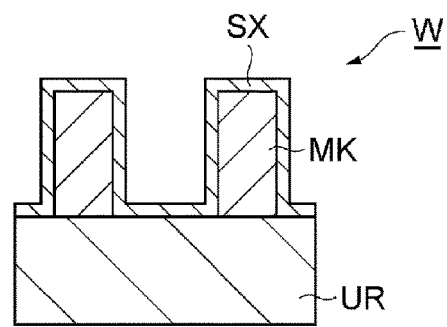

If it is determined in the process STJ that the repetition number of the sequence SQA has not reached the predetermine value, the sequence SQA is repeated again from the process STA1. Accordingly, a silicon-containing film SF is further formed, as depicted in FIG. 3D. Then, as the silicon-containing film SF is oxidized, the silicon oxide film SX is further formed, as shown in FIG. 3E. Meanwhile, if it is determined in the process STJ that the repetition number of the sequence SQA has reached the predetermined value, the sequence SQA is not performed. Through this repetition of the sequence SQA, the silicon oxide film SX having the required thickness is formed on the surface of the wafer W, as illustrated in FIG. 3F.

In the method MTA, the thickness of the silicon oxide film SX can be adjusted to a desired thickness by controlling the repetition number of the sequence SQA. Thus, it is possible to adjust an opening width of the mask MK to a required value.

Furthermore, according to the method MTA, in the process STA2 between the process STA1 and the process STA3, a bond on the surface of the precursor of the silicon-containing film SF is activated by active species of atoms of the rare gas. Further, in the process STA4, a bond on the surface of the silicon oxide film SX is activated. Accordingly, oxygen deficiency in a Si—O network in the silicon oxide film SX can be suppressed. Thus, the formed silicon oxide film SX is highly densified. That is, it is possible to form the silicon oxide film SX having a high density and a small thickness on the surface of the wafer W conformally through the single sequence SQA. By repeating this sequence SQA, it is possible to form the silicon oxide film SX having high in-plane uniformity and conformal coatability on the surface of the wafer W conformally even when the wafer W has a mask MK provided with an opening having a high aspect ratio. That is, non-uniformity in the thickness of the silicon oxide film SX formed on the surface of the wafer W can be reduced.

Figure 3F:
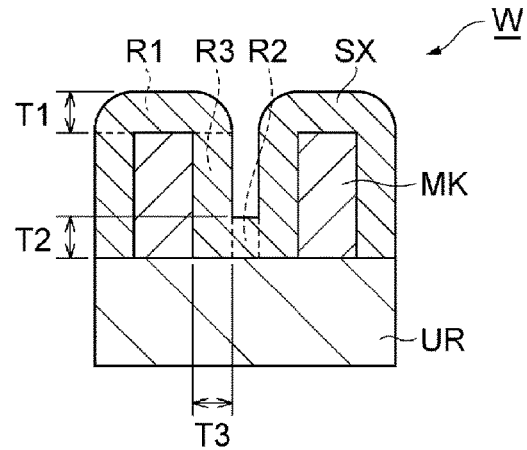

To be more specific, referring to FIG. 3F, the silicon oxide film SX includes a region R1, a region R2 and a region R3. The region R3 is an area extended on and along a side surface of the mask MK, i.e., a sidewall surface of the mask MK confining an opening OP. The region R1 is extended on a top surface of the mask MK and on the region R3. Further, the region R2 is extended between adjacent regions R3 and on a surface of the underlying region UR. According to the method MTA, even on the wafer W having the mask MK provided with the opening OP having a high aspect ratio, it is possible to reduce a difference in thicknesses T1, T2 and T3 of the silicon oxide film on the regions R1, R2 and R3, respectively.

Further, in the process STA1 of the sequence SQA, the silicon halide gas is used as a gas for generating the precursor. In general, an aminosilane-based gas is used as the gas for the precursor, and the aminosilane is a liquid source having a high boiling point. On the other hand, the gas for the precursor used in the process STA1 is the silicon halide gas such as, but not limited to, $SiCl_4$ gas, $SiBr_4$ gas, $SiF_4$ gas or $SiH_2Cl_4$ gas, which is in a vaporized state at a room temperature. Accordingly, in the process STA1, it is possible to deposit the silicon-containing precursor on the wafer W at a low temperature without needing to use a dedicated film forming apparatus having a vaporizer.

Moreover, although the internal pressure of the processing vessel 12 at the time of performing the process STA1 is not particularly limited, the internal pressure may be set to be equal to or higher than 13.33 Pa (100 mTorr) in the exemplary embodiment. Further, when performing the process STA1, the high frequency power of the first high frequency power supply 62 is set to be equal to or less than 100 W. By generating plasma under this high-pressure and low-power condition, excessive dissociation of the silicon halide gas can be suppressed. That is, excessive generation of active species of halogen atoms can be suppressed. Here, as a method of generating the same plasma state while suppressing the excessive dissociation, the second high frequency power supply 64 may be used. Accordingly, damage on the mask MK and/or damage on the previously formed silicon oxide film can be suppressed. Moreover, it is also possible to reduce the difference in the thicknesses on the region R1, the region R2 and the region R3. In addition, even if there is a dense region in which the mask MK is densely formed and a sparse region in which the mask MK is sparsely formed, that is, even if the mask MK has a densely patterned region and a sparsely patterned region, it is possible to reduce a difference in thicknesses of the silicon oxide films on these two regions.

Further, in the exemplary embodiment, when performing the process STA1, the high frequency bias power from the second high frequency power supply 64 is not or hardly supplied to the lower electrode LE. It is because anisotropic component is generated by applying the bias power. By minimizing the bias power as stated, the precursor can be attached to the wafer W isotropically. As a result, uniformity in the thickness of the silicon oxide films respectively formed on the top surface and the side surface of the mask MK and on the surface of the base of the mask MK can be further improved. Furthermore, in case of generating the plasma by using the second high frequency power supply 64, it is necessary to select a condition where ion energy is minimized to attach the precursor isotropically. In addition, in the process STA3, in order to substitute the precursor attached in the process STA1 with the silicon oxide film, an isotropic reaction same as that of the above-described process STA1 is required. For this reason, in the process STA3, the high frequency power from the second high frequency power supply 64 is not or hardly supplied to the lower electrode LE.

Figure 5:
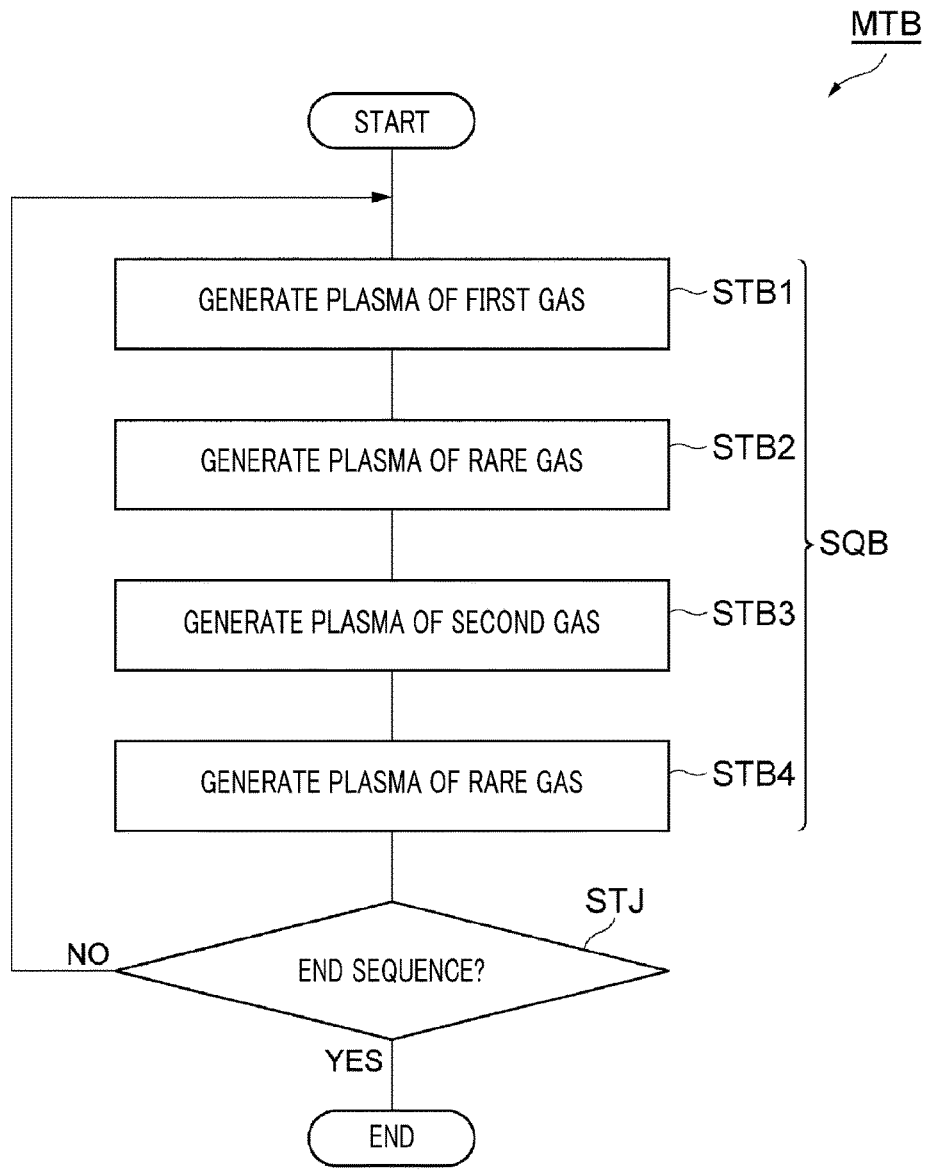
FIG. 5 is a flowchart for describing a method of processing a processing target object according to another exemplary embodiment.

Now, a method of processing a processing target object according to another exemplary embodiment will be described. FIG. 5 is a flowchart for describing the method of processing the processing target object according to another exemplary embodiment. FIG. 6 presents timing charts regarding generation of plasma and a flow rate of a rare gas in the method shown in FIG. 5. FIG. 6 provides timing charts regarding plasma of a silicon halide gas, plasma of an oxygen gas and plasma of the rare gas, as in FIG. 4. On each timing chart of FIG. 6, a high level (indicated by "H" in the drawing) represents a state where the plasma of each gas is generated, and a low level (indicated by "L" in the drawing) represents a state where the plasma of each gas is not generated. Further, FIG. 6 also provides a timing chart for the flow rate of the rare gas supplied into the processing vessel of the plasma processing apparatus. On the timing chart for the flow rate of the rare gas, a higher level indicates a higher flow rate of the rare gas.

In the method MTB shown in FIG. 5, as in the method MTA, a silicon oxide film SX is formed on a surface of a wafer W by repeating a sequence SQB. Further, in a process STJ of the method MTB, it is determined whether to end the repetition of the sequence in the same manner as the process STJ of the method MTA.

The sequence SQB includes a process STB1, a process STB2, a process STB3 and a process STB4. The process STB1 is the same process as the process STA1 of the sequence SQA. In the process STB1, plasma of a first gas is generated within the processing vessel 12 of the plasma processing apparatus 10. The process STB2 is the same process as the process STA2 of the sequence SQA. In the process STB2, plasma of a rare gas is generated within the processing vessel 12. The process STB3 is the same process as the process STA3 of the sequence SQA. In the process STB3, plasma of a second gas is generated within the processing vessel 12. Further, the process STB4 is the same process as the process STA4 of the sequence SQA. In the process STB4, plasma of a rare gas is generated within the processing vessel 12.

In the sequence SQB, however, the process STB1, the process STB2, the process STB3 and the process STB4 are performed consecutively in sequence. That is, in the sequence SQB, the purging processes such as the processes STP1, STP2, STP3 and STP4 of the sequence SQA are not performed.

Furthermore, in the sequence SQB, the plasma of the rare gas is generated throughout the process STB1, the process STB2, the process STB3 and the process STB4, as shown in FIG. 6. That is, throughout the whole period during which the sequence SQB is performed, the rare gas is supplied into the processing vessel 12 and the plasma of the rare gas is generated. In the present exemplary embodiment, the rare gas is supplied into the processing vessel 12 prior to performing the process STB1 of the sequence SQB. Then, by supplying the high frequency power for plasma generation, the plasma of the rare gas is generated. Thereafter, by supplying a silicon halide gas into the processing vessel 12, the plasma of the first gas may be generated.

In the method MTB including the sequence SQB, the silicon halide gas supplied into the processing vessel 12 in the process STB1 is exhausted from the space within the processing vessel 12 while generating the plasma of the rare gas in the process STB2. In the process STB2 of the exemplary embodiment, emission of the plasma within the processing vessel 12 is measured by an optical emission spectrometer (OES). When the emission based on the silicon halide gas is hardly observed, the process STB2 is ended. Further, an oxygen gas supplied into the processing vessel 12 in the process STB3 is exhausted from the space within the processing vessel 12 during the generation of the plasma of the rare gas in the process STB4. In the process STB4 of the exemplary embodiment, emission of the plasma within the processing vessel 12 is measured by the OES, and when the emission based on the oxygen gas is hardly observed, the process STB4 is ended.

As can be clearly seen from the above description, it is not required to perform the purging process additionally in the method MTB. Further, it is also possible to omit a time period for plasma stabilization. That is, it is not necessary to secure a period for stabilizing the plasma before performing each process with the plasma. Thus, according to the method MTB, the throughput can be improved.

In the method MTB, the flow rate of the rare gas supplied throughout the whole period during which the sequence SQB is performed may be maintained constant, or varied. In the exemplary embodiment, as shown in FIG. 6, the flow rate of the rare gas supplied into the processing vessel 12 in the process STB4 is set to be higher than the flow rate of the rare gas supplied into the processing vessel 12 in the process STB3. Accordingly, the oxygen gas used in the process STB3 can be rapidly exhausted from the space within the processing vessel 12. Therefore, the throughput can be further improved.

Moreover, according to the present exemplary embodiment, the flow rate of the rare gas supplied into the processing vessel 12 in the process STB4 may be set to be five or more times as high as the flow rate of the rare gas supplied into the processing vessel 12 in the process STB3. By using the rare gas in such a flow rate range in the process STB4, the oxygen gas used in the process STB3 can be more rapidly exhausted from the space within the processing vessel 12.

Now, an example method of processing the processing target object including the method MTA or the method MTB will be explained. FIG. 7 is a flowchart for describing the example method of processing the processing target object including the method shown in FIG. 1 or the method shown in FIG. 5. Further, FIG. 8A to FIG. 8C and FIG. 9A to FIG. 9C are cross sectional views showing states of the processing target object after individual processes of the method shown in FIG. 7 are performed.

Figure 8A:
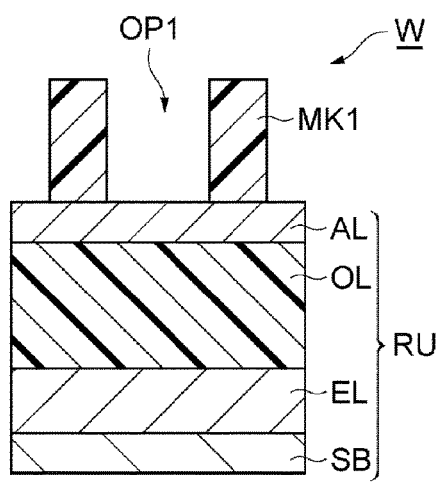
FIG. 8A to FIG. 8C are cross sectional views illustrating states of the processing target object after individual processes of the method shown in FIG. 7 are performed.

In the method MT1 depicted in FIG. 7, a wafer W is first prepared in a process ST1. As depicted in FIG. 8A, the wafer W prepared in the process ST1 includes, as an underlying region RU, a substrate SB, an etching target layer EL, an organic film OL and an antireflection film AL. Also, the wafer W further includes a mask MK1. The etching target layer EL is provided on the substrate SB. The etching target layer EL is made of a material to be selectively etched against the organic film OL. An insulating film is used as the etching target layer EL. By way of example, the etching target layer EL may be made of, but not limited to, silicon oxide ($SiO_2$). Further, the etching target layer EL may also be made of another material such as polycrystalline silicon. The organic film OL is provided on the etching target layer EL. The organic film OL contains carbon and may be, for example, a SOH (Spin On Hard mask) layer. The antireflection film AL is a silicon-containing antireflection film and is provided on the organic film OL.

The mask MK1 is provided on the antireflection film AL. The mask MK1 is a resist mask made of a resist material. The mask MK1 is prepared by patterning a resist layer through the photolithography. The mask MK1 partially covers the antireflection film AL. Further, the mask MK1 is provided with an opening OP1 through which the antireflection film AL is partially exposed. A pattern of the mask MK1 is, for example, a line-and-space pattern. Further, the mask MK1 may have a pattern provided with a circular opening when viewed from the top. Alternatively, the mask MK1 may have a pattern provided with an elliptical opening when viewed from the top.

In the process ST1, the wafer W shown in FIG. 8A is prepared, and the wafer W is accommodated in the processing vessel 12 of the plasma processing apparatus 10 to be mounted on the mounting table PD.

Subsequently, in the method MT1, a process ST2 is performed. In the process ST2, secondary electrons are irradiated to the wafer W. To elaborate, the hydrogen gas and the rare gas are supplied into the processing vessel 12, and by supplying the high frequency power from the first high frequency power supply 62, plasma is generated. Further, the negative DC voltage is applied to the upper electrode 30 from the power supply 70. Accordingly, positive ions in the processing space S are attracted to collide with the upper electrode 30. As a result of the collision of the positive ions with the upper electrode 30, the secondary electrons are emitted from the upper electrode 30. As the emitted secondary electrons are irradiated to the wafer W, the mask MK1 is modified. Further, in case that an absolute value of the negative DC voltage applied to the upper electrode 30 is of a high level, silicon constituting the electrode plate 34 as well as the secondary electrons is also emitted when the positive ions collide with the electrode plate 34. The emitted silicon bonds with oxygen emitted from components of the plasma processing apparatus 10 exposed to the plasma. The oxygen is emitted from members such as, by way of example, the supporting member 14, the insulating shield member 32 and the deposition shield 46. As a result of the bond between the silicon and the oxygen, a silicon oxide compound is generated. The silicon oxide compound is deposited on the wafer W, so that the silicon oxide compound covers and protects the mask MK1. Due to these effects of the modification and the protection, damage on the mask MK1 caused by a subsequent process is suppressed. Further, in the process ST2, the emission of the silicon may be suppressed by minimizing the bias power from the second high frequency power supply 64 in order to achieve the effect of the protection or the modification by the irradiation of the secondary electrons.

Figure 8C:
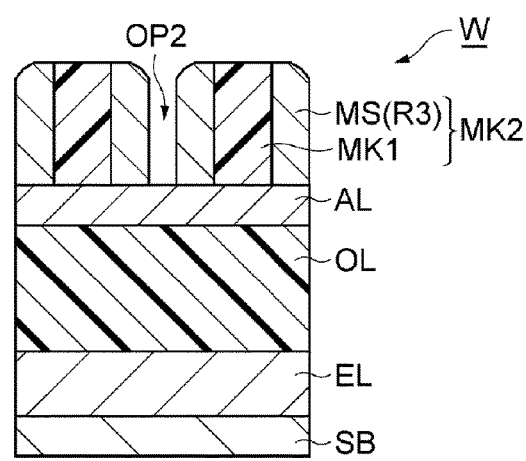
Figure 8B:
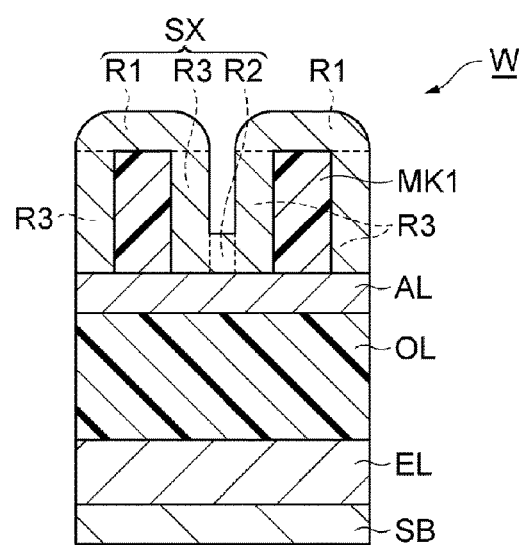

Subsequently, in the method MT1, a process ST3 is performed. In the process ST3, the above-described method MTA or MTB is performed. Accordingly, as depicted in FIG. 8B, the silicon oxide film SX is formed on the surface of the mask MK1 and on the antireflection film AL.

Thereafter, in the method MT1, a process ST4 is performed. In the process ST4, the silicon oxide film SX is etched such that the region R1 and the region R2 are removed. To remove the regions R1 and R2, the anisotropic etching condition is required. For this purpose, in the process ST4, a processing gas containing a fluorocarbon gas is supplied into the processing vessel 12 from the gas source selected from the plurality of gas sources belonging to the gas source group 40. Further, the high frequency power is supplied from the first high frequency power supply 62 to generate plasma. Further, the high frequency bias power is also supplied from the second high frequency power supply 64. Also, by operating the gas exhaust device 50, an internal pressure of the space within the processing vessel 12 is set to a predetermined value. As a result, the plasma of the fluorocarbon gas is generated. Fluorine-containing active species in the generated plasma are vertically attracted by the high frequency bias power to etch the region R1 and the region R2 preferentially. As a result, as illustrated in FIG. 8C, the region R1 and the region R2 are removed, and a mask MS is formed from the remaining region R3. The mask MS and the mask MK1 form together a mask MK2 designed to reduce the width of the opening OP1 of the mask MK1. This mask MK2 is provided with an opening OP2 having a smaller width than the opening OP1.

Figure 9A:
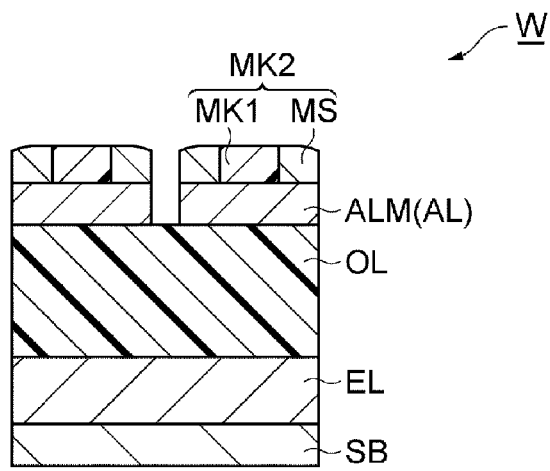
FIG. 9A to FIG. 9C are cross sectional views illustrating states of the processing target object after individual processes of the method shown in FIG. 7 are performed.

Subsequently, in a process ST5, the antireflection film AL is etched. To elaborate, a processing gas containing a fluorocarbon gas is supplied into the processing vessel 12 from the gas source selected from the plurality of gas sources belonging to the gas source group 40. Further, the high frequency power is supplied from the first high frequency power supply 62. Further, the high frequency bias power is also supplied from the second high frequency power supply 64. Also, by operating the gas exhaust device 50, the internal pressure of the space within the processing vessel 12 is set to a preset value. As a result, plasma of the fluorocarbon gas is generated. Fluorine-containing active species in the generated plasma etch a region of the antireflection film AL exposed through the mask MK2. As a consequence, a mask ALM is formed from the antireflection film AL, as illustrated in FIG. 9A. Thereafter, the mask MK2 may be removed.

Figure 9B:
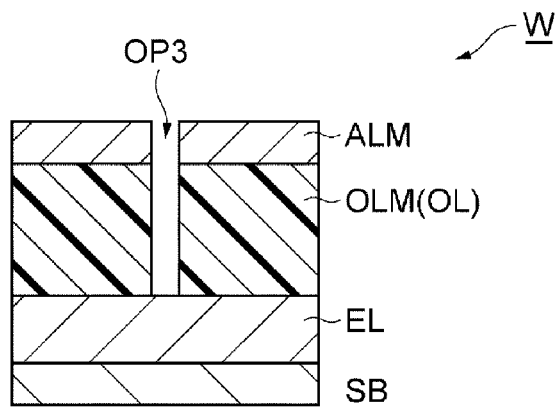

Subsequently, in a process ST6, the organic film OL is etched. To elaborate, a processing gas containing an oxygen gas is supplied into the processing vessel 12 from the gas source selected from the plurality of gas sources belonging to the gas source group 40. Further, the high frequency power is supplied from the first high frequency power supply 62. Further, the high frequency bias power is also supplied from the second high frequency power supply 64. Also, by operating the gas exhaust device 50, the internal pressure of the space within the processing vessel 12 is set to a predetermined value. As a result, plasma of the processing gas containing the oxygen gas is generated. Active species of oxygen in the generated plasma etch a region of the organic film OL exposed through the mask ALM. As a consequence, a mask OLM is formed from the organic film OL, as shown in FIG. 9B. A width of an opening OP3 of the mask OLM is approximately equal to the width of the opening OP2 (see FIG. 8C). Further, a processing gas containing a nitrogen gas and a hydrogen gas may also be used as the gas for etching the organic film OL.

Figure 9C:
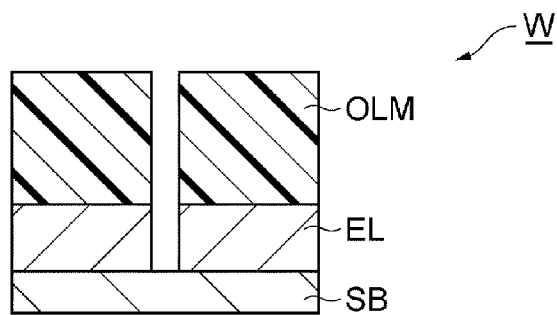

Thereafter, in a process ST7, the etching target layer EL is etched. To elaborate, a processing gas is supplied into the processing vessel 12 from the gas source selected from the plurality of gas sources belonging to the gas source group 40. The processing gas may be appropriately selected based on the material of the etching target layer EL. By way of example, if the etching target layer EL is made of silicon oxide, the processing gas may contain a fluorocarbon gas. Further, the high frequency power is supplied from the first high frequency power supply 62. Further, the high frequency bias power is also supplied from the second high frequency power supply 64. Also, by operating the gas exhaust device 50, the internal pressure of the space within the processing vessel 12 is set to a predetermined value. As a result, plasma is generated. Active species in the generated plasma etch a region of the etching target layer EL exposed through the mask OLM. As a consequence, a pattern of the mask OLM is transcribed onto the etching target layer EL, as shown in FIG. 9C. According to this method MT1 as described above, all processes from the process ST2 to the process ST7, that is, the entire processes from the forming of the masks based on the resist mask to the etching of the etching target layer can be performed in the single plasma processing apparatus 10.

Figure 10:
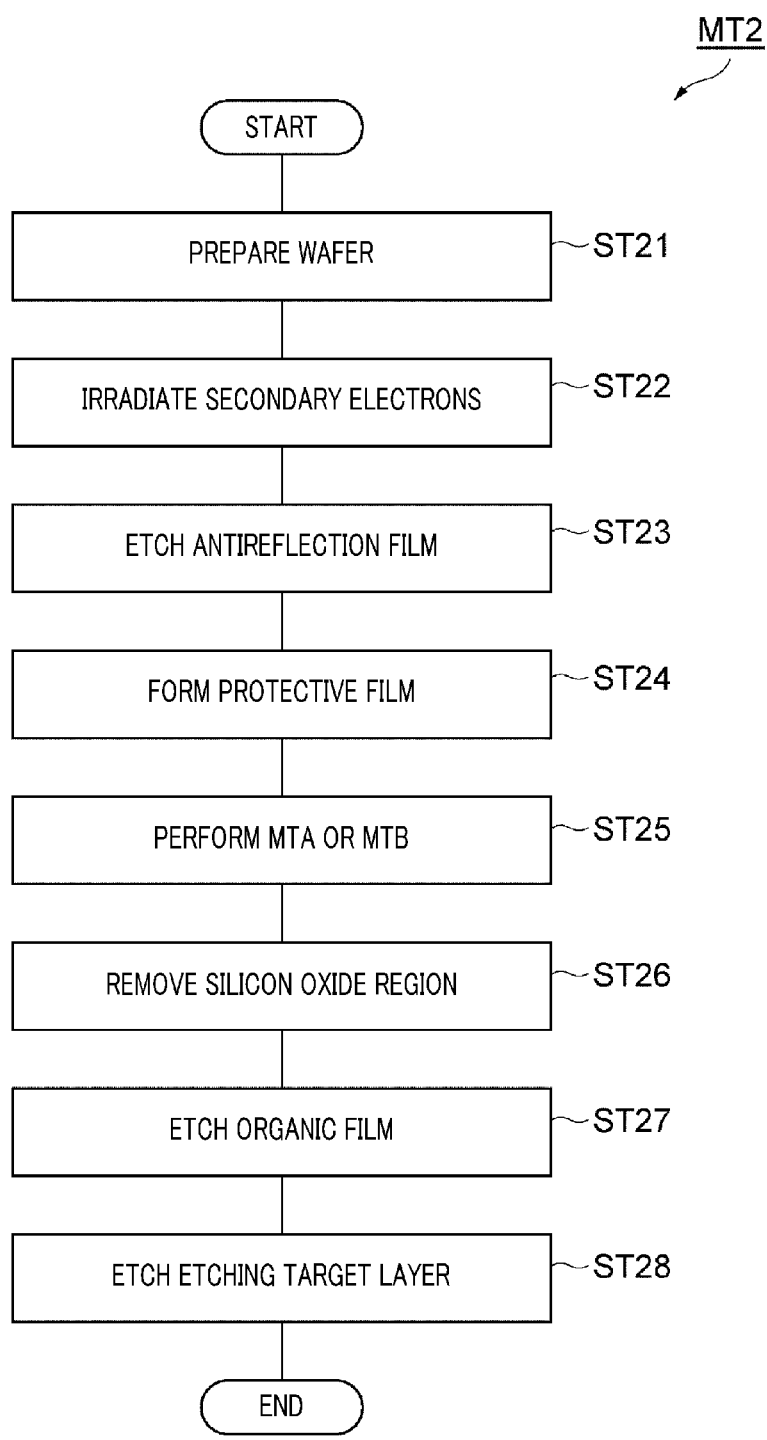
FIG. 10 is a flowchart for describing another example method of processing a processing target object including the method shown in FIG. 1 or the method shown in FIG. 5.

Now, another example method of processing the processing target object including the method MTA or the method MTB will be discussed. FIG. 10 is a flowchart for describing another example method of processing the processing target object including the method shown in FIG. 1 or the method shown in FIG. 5. Further, FIG. 11A to FIG. 11D and FIG. 12A to FIG. 12C are cross sectional views showing states of the processing target object after individual processes of the method shown in FIG. 10 are performed.

In the method MT2 depicted in FIG. 10, a process ST21 is first performed. The process ST21 is the same as the process ST1 of the method MT1. In the process ST21, a wafer W illustrated in FIG. 11A, i.e., a wafer W which is the same as the wafer shown in FIG. 8A is prepared. The wafer W is accommodated in the processing vessel 12 to be mounted on the mounting table PD.

Thereafter, in the method MT2, a process ST22 which is the same as the process ST2 of the method MT1 is performed. That is, the secondary electrons are irradiated to the wafer W, and the mask MK1 is modified. When an absolute value of the negative DC voltage applied to the upper electrode 30 is of a high level, as described in the process ST2, the silicon oxide compound is generated by the bond between silicon emitted from the electrode plate 34 by sputtering of the electrode plate 34 and oxygen emitted from the components of the plasma processing apparatus 10 exposed to the plasma. The silicon oxide compound may be deposited on the wafer W to protect the mask MK1.

Subsequently, in a process ST23, the antireflection film AL is etched. To elaborate, a processing gas containing a fluorocarbon gas is supplied into the processing vessel 12 from the gas source selected from the plurality of gas sources belonging to the gas source group 40. Further, the high frequency power is supplied from the first high frequency power supply 62. Furthermore, the high frequency bias power is also supplied from the second high frequency power supply 64. By operating the gas exhaust device 50, an internal pressure of the space within the processing vessel 12 is set to a predetermined value. As a result, plasma of the fluorocarbon gas is generated. Fluorine-containing active species in the generated plasma etch a region of the antireflection film AL exposed through the mask MK1. As a consequence, a mask ALM2 is formed from the antireflection film AL, as shown in FIG. 11B.

Figure 11A:
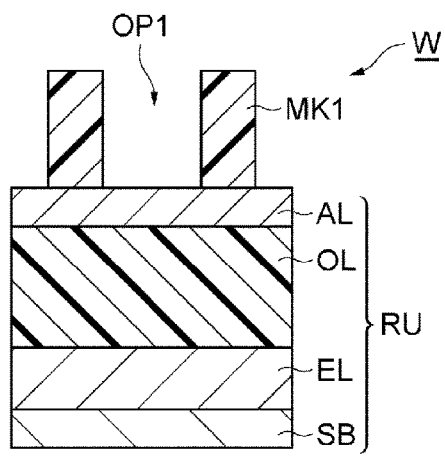
FIG. 11A to FIG. 11D are cross sectional views illustrating states of the processing target object after individual processes of the method shown in FIG. 10 are performed.
Figure 11B:
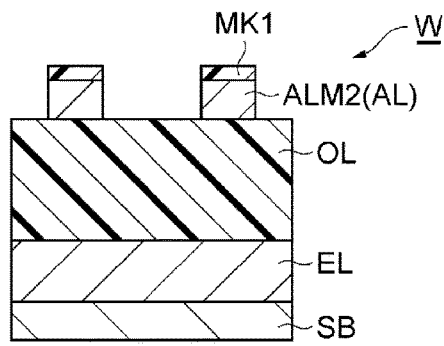

Thereafter, in a process ST24, a protective film PF is formed on a surface of the wafer W shown in FIG. 11B. The protective film PF is formed to protect the organic film OL from active species of oxygen generated when performing the method MTA or the method MTB to be performed subsequently.

Figure 11C:
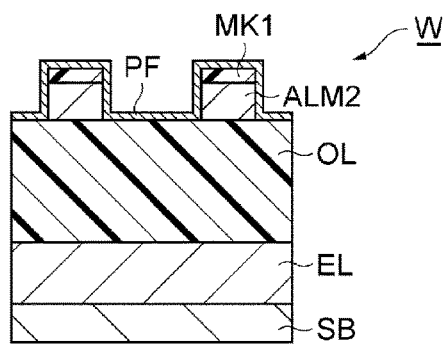

In one exemplary embodiment, the electrode plate 34 of the upper electrode 30 is made of silicon. In the process ST24 of the present exemplary embodiment, a mixed gas containing a hydrogen gas and a rare gas, for example, is supplied into the processing vessel 12 from the gas sources selected from the plurality of gas sources belonging to the gas source group 40. Further, the high frequency power is supplied from the first high frequency power supply 62. In addition, by operating the gas exhaust device 50, the internal pressure of the space within the processing vessel 12 is set to a preset value. As a result, plasma is generated within the processing vessel 12. Furthermore, the negative DC voltage is applied to the upper electrode 30 from the power supply 70. Accordingly, the positive ions in the plasma collide with the electrode plate 34, and silicon is emitted from the electrode plate 34. Further, oxygen is emitted from the components of the plasma processing apparatus 10 exposed to the plasma. The oxygen emitted as stated above bonds with the silicon emitted from the electrode plate 34, so that silicon oxide is generated. The generated silicon oxide is deposited on the wafer W, so that the protective film PF is formed as shown in FIG. 11C.

In the process ST24 according to another exemplary embodiment, a mixed gas containing a silicon halide gas and an oxygen gas is supplied into the processing vessel 12 from the gas sources selected from the plurality of gas sources belonging to the gas source group 40. Further, the high frequency power is supplied from the first high frequency power supply 62. Further, by operating the gas exhaust device 50, the internal pressure of the space within the processing vessel 12 is set to a predetermined value. As a result, the silicon oxide is generated to be deposited on the wafer W, so that the protective film PF is formed as shown in FIG. 11C.

In still another exemplary embodiment, the electrode plate 34 of the upper electrode 30 may be made of silicon oxide. In the process ST24 of the present exemplary embodiment, a mixed gas containing a hydrogen gas and a rare gas, for example, is supplied into the processing vessel 12 from the gas sources selected from the plurality of gas sources belonging to the gas source group 40. Further, the high frequency power is supplied to the upper electrode 30 from the first high frequency power supply 62. Furthermore, by operating the gas exhaust device 50, the internal pressure of the space within the processing vessel 12 is set to a preset value. As a result, plasma is generated within the processing vessel 12. Further, charged particles in the plasma are made to collide with the electrode plate 34 by a sheath voltage generated in the vicinity of the upper electrode 30. As a consequence, the silicon oxide is emitted from the electrode plate 34 to be deposited on the wafer W, so that the protective film PF formed as shown in FIG. 11C. Further, in the process ST24, to form the protective film by depositing the silicon oxide, the high frequency bias power from the second high frequency power supply 64 needs to be minimized.

Figure 11D:
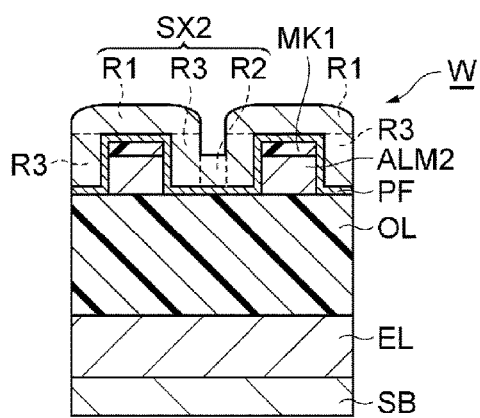

In the method MT2, a process ST25 is performed subsequently. In the process ST25, the above-described method MTA or MTB is performed. Accordingly, as depicted in FIG. 11D, a silicon oxide film SX2 is formed on the surface of the wafer W. The silicon oxide film SX2 includes a region R1, a region R2 and a region R3. The region R3 is an area extended on and along side surfaces of the mask MK1 and the mask ALM2. The region R3 is extended from a surface of the protective film PF formed on the organic film OL up to a lower end of the region R1. The region R1 is extended on a top surface of the mask MK1 and on the region R3. Further, the region R2 is extended between adjacent regions R3 and on a surface of the organic film OL (i.e., on the protective film PF on the organic film OL).

Figure 12A:
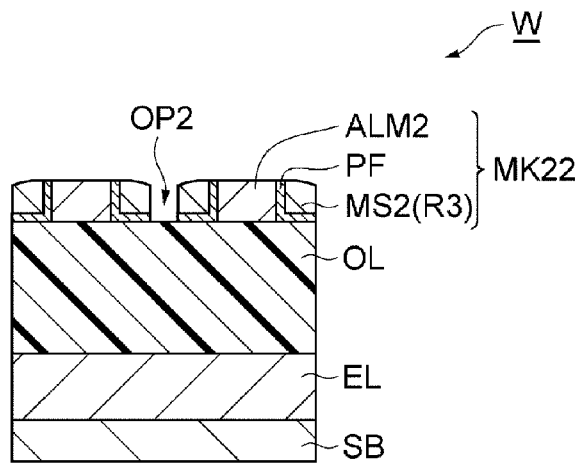
FIG. 12A to FIG. 12C are cross sectional views illustrating states of the processing target object after individual processes of the method shown in FIG. 10 are performed.

Then, in the method MT2, a process ST26 is performed. In the process ST26, the silicon oxide film SX2 is etched to remove the region R1 and the region R2. To elaborate, a processing gas containing a fluorocarbon gas is supplied into the processing vessel 12 from the gas source selected from the plurality of gas sources belonging to the gas source group 40. Further, the high frequency power is supplied from the first high frequency power supply 62, and the high frequency bias power is also supplied from the second high frequency power supply 64. Further, by operating the gas exhaust device 50, the internal pressure of the space within the processing vessel 12 is set to a predetermined value. As a result, plasma of the fluorocarbon gas is generated. Fluorine-containing active species in the generated plasma are vertically attracted by the high frequency bias power and etch the region R1 and the region R2 preferentially. As a result, as illustrated in FIG. 12A, the region R1 and the region R2 are removed, and a mask MS2 is formed from the remaining region R3. The mask MS2 and the mask ALM2 form together a mask MK22 designed to reduce the width of an opening OP1 of the mask MK1. This mask MK22 is provided with an opening OP2 having a smaller width than the opening OP1.

Figure 12B:
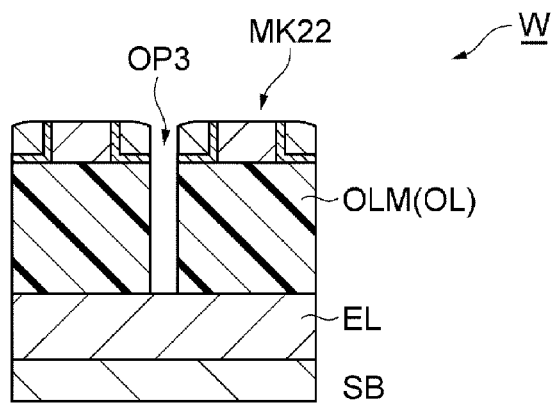

Subsequently, in a process ST27, the organic film OL is etched. To elaborate, a processing gas containing an oxygen gas is supplied into the processing vessel 12 from the gas source selected from the plurality of gas sources belonging to the gas source group 40. Further, the high frequency power is supplied from the first high frequency power supply 62, and the high frequency bias power is also supplied from the second high frequency power supply 64. Further, by operating the gas exhaust device 50, the internal pressure of the space within the processing vessel 12 is set to a predetermined value. As a result, plasma of the processing gas containing the oxygen gas is generated. Active species of oxygen in the generated plasma etch a region of the organic film OL exposed through the mask MK22. As a consequence, a mask OLM is formed from the organic film OL, as shown in FIG. 12B. The width of an opening OP3 of the mask OLM is approximately equal to the width of the opening OP2 (see FIG. 12A).

Figure 12C:
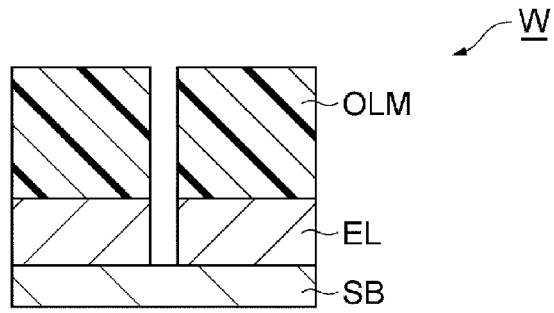

Subsequently, in a process ST28, the etching target layer EL is etched. To elaborate, a processing gas is supplied into the processing vessel 12 from the gas source selected from the plurality of gas sources belonging to the gas source group 40. The processing gas may be appropriately selected based on a material of the etching target layer EL. By way of example, if the etching target layer EL is made of silicon oxide, the processing gas may contain a fluorocarbon gas. Further, the high frequency power is supplied from the first high frequency power supply 62, and the high frequency bias power is also supplied from the second high frequency power supply 64. Further, by operating the gas exhaust device 50, the internal pressure of the space within the processing vessel 12 is set to a predetermined value. As a result, plasma is generated. Active species in the generated plasma etch a region of the etching target layer EL exposed through the mask OLM. As a consequence, a pattern of the mask OLM is transcribed onto the etching target layer EL, as depicted in FIG. 12C.

According to the method MT2 as described above, all processes from the process ST22 to the process ST28, that is, the whole processes from the forming of the masks based on the resist mask to the etching of the etching target layer can be performed in the single plasma processing apparatus 10.

In the above, the various exemplary embodiments have been described. However, the above-described exemplary embodiments are not limiting, and various changes and modifications may be made. For example, in the above-described exemplary embodiments, the capacitively coupled plasma processing apparatus 10 is used. However, as long as a method in which the emitting of the secondary electrons, the silicon or the silicon oxide from the upper electrode is omitted respectively from the method MT1 and the method MT2 is performed, it is possible to use any of various types of plasma processing apparatus having a plasma source. Such a plasma processing apparatus may be, by way of example, but not limited to, an inductively coupled plasma processing apparatus, a plasma processing apparatus using a surface wave such as a microwave, etc.

Now, various experiments conducted to evaluate the above-stated methods MTA and MTB will be described.

Experimental Examples 1 and 2 and Comparative Example 1

In an experimental example 1, a silicon oxide film is formed on a flat surface of a wafer having a diameter of 300 mm by performing the method MTA. Further, in an experimental example 2, a silicon oxide film is formed on a flat surface of a wafer having a diameter of 300 mm by performing the method MTB. Furthermore, in a comparative example 1, a silicon oxide film is formed on a flat surface of a wafer having a diameter of 300 mm by performing a method in which the process STA2, the process STP2, the process STA4 and the process STP4 are omitted from the method MTA.

In the experimental example 1, processing conditions are set as follows. Further, in the experimental example 1, the sequence SQA is repeated 60 times.

<Conditions for the Process STA1>
Internal pressure of the processing vessel: 200 mTorr (26.66 Pa)
$SiCl_4$ gas flow rate: 14 sccm
Ar gas flow rate: 200 sccm
High frequency power of the first high frequency power supply 62 (supplied to the upper electrode 30): 60 MHz, 100 W
High frequency bias power of the second high frequency power supply 64: 13.56 MHz, 0 W
Processing time: 2 seconds <Conditions for the Process STA2>
Internal pressure of the processing vessel: 200 mTorr (26.66 Pa)
Ar gas flow rate: 200 sccm
High frequency power of the first high frequency power supply 62 (supplied to the upper electrode 30): 60 MHz, 100 W
High frequency bias power of the second high frequency power supply 64: 13.56 MHz, 0 W
Processing time: 10 seconds <Conditions for the Process STA3>
Internal pressure of the processing vessel: 200 mTorr (26.66 Pa)
$O_2$ gas flow rate: 200 sccm
Ar gas flow rate: 200 sccm
High frequency power of the first high frequency power supply 62 (supplied to the upper electrode 30): 60 MHz, 500 W
High frequency bias power of the second high frequency power supply 64: 13.56 MHz, 0 W
Processing time: 5 seconds
<Conditions for the Process STA4>
Internal pressure of the processing vessel: 200 mTorr (26.66 Pa)
Ar gas flow rate: 1300 sccm
High frequency power of the first high frequency power supply 62 (supplied to the upper electrode 30): 60 MHz, 100 W
High frequency bias power of the second high frequency power supply 64: 13.56 MHz, 0 W
Processing time: 20 seconds In the experimental example 2, processing conditions are set as follows. Further, in the experimental example 2, the sequence SQB is repeated 60 times.
<Conditions for the Process STB1>
Internal pressure of the processing vessel: 200 mTorr (26.66 Pa)
$SiCl_4$ gas flow rate: 3 sccm
Ar gas flow rate: 200 sccm
High frequency power of the first high frequency power supply 62 (supplied to the upper electrode 30): 60 MHz, 100 W
High frequency bias power of the second high frequency power supply 64: 13.56 MHz, 0 W
Processing time: 30 seconds
<Conditions for the Process STB2>
Internal pressure of the processing vessel: 200 mTorr (26.66 Pa)
Ar gas flow rate: 200 sccm
High frequency power of the first high frequency power supply 62 (supplied to the upper electrode 30): 60 MHz, 100 W
High frequency bias power of the second high frequency power supply 64: 13.56 MHz, 0 W
Processing time: 60 seconds
<Conditions for the Process STB3>
Internal pressure of the processing vessel: 200 mTorr (26.66 Pa)
$O_2$ gas flow rate: 200 sccm
Ar gas flow rate: 200 sccm
High frequency power of the first high frequency power supply 62 (supplied to the upper electrode 30): 60 MHz, 500 W
High frequency bias power of the second high frequency power supply 64: 13.56 MHz, 0 W
Processing time: 5 seconds
<Conditions for the Process STB4>
Internal pressure of the processing vessel: 200 mTorr (26.66 Pa)
Ar gas flow rate: 200 sccm
High frequency power of the first high frequency power supply 62 (supplied to the upper electrode 30): 60 MHz, 100 W
High frequency bias power of the second high frequency power supply 64: 13.56 MHz, 0 W
Processing time: 60 seconds Furthermore, in the comparative example 1, processing conditions are set as follows. A sequence in this comparative example 1 is repeated 60 times.
<Conditions for the Process STA1>
Internal pressure of the processing vessel: 200 mTorr (26.66 Pa)
$SiCl_4$ gas flow rate: 20 sccm
Ar gas flow rate: 200 sccm
High frequency power of the first high frequency power supply 62 (supplied to the upper electrode 30): 60 MHz, 100 W
High frequency bias power of the second high frequency power supply 64: 13.56 MHz, 0 W
Processing time: 5 seconds
<Conditions for the Process STA3>
Internal pressure of the processing vessel: 200 mTorr (26.66 Pa)
$O_2$ gas flow rate: 200 sccm
Ar gas flow rate: 200 sccm
High frequency power of the first high frequency power supply 62 (supplied to the upper electrode 30): 60 MHz, 500 W
High frequency bias power of the second high frequency power supply 64: 13.56 MHz, 0 W
Processing time: 5 seconds Then, in-plane uniformities (%) of the silicon oxide films formed in the experimental example 1, the experimental example 2 and the comparative example 1 are calculated, respectively. The in-plane uniformity is defined by (MAX−MIN)/(2×AVE)×100. Here, 'MAX' denotes a maximum value of the film thicknesses obtained by measuring the thicknesses of the silicon oxide film at different positions on the wafer; 'MIN' represents a minimum value of the film thicknesses; and 'AVE' refers to an average value of the film thicknesses. As a result of calculating the in-plane uniformity defined as stated above, the in-plane uniformity of the silicon oxide film formed in the experimental example 1 is found to be 2.5%, and the in-plane uniformity of the silicon oxide film formed in the experimental example 2 is found to be 3.5%. Meanwhile, the in-plane uniformity of the thickness of the silicon oxide film formed in the comparative example 1 is found to be 34%. In comparison between the experimental examples 1 and 2 and the comparative example 1 based on these results, it is found out that the in-plane uniformity of the thickness of the silicon oxide film can be greatly improved in the experimental example 1 and the experimental example 2, as compared to the comparative example 1. That is, it is found out that the in-plane uniformity of the thickness of the formed silicon oxide film can be greatly improved by performing the method MTA and the method MTB in which the wafer is exposed to the plasma of the rare gas between the forming of the precursor and the oxidizing of the precursor.

Experimental Example 3 and Comparative Example 2

In an experimental example 3, a silicon oxide film is formed on a flat surface of a wafer having a diameter of 300 mm by performing the method MTA. Further, in a comparative example 2, a silicon oxide film is formed on a flat surface of a wafer having a diameter of 300 mm by performing a method in which the processes STP1, STP2, STP3 and STP4 are omitted from the method MTA.

In the experimental example 3, processing conditions are set as follows. Further, in the experimental example 3, the sequence SQA is repeated 60 times.

<Conditions for the Process STA1>
Internal pressure of the processing vessel: 200 mTorr (26.66 Pa)
SiCl$_4$ gas flow rate: 14 sccm
Ar gas flow rate: 200 sccm
High frequency power of the first high frequency power supply 62 (supplied to the upper electrode 30): 60 MHz, 100 W
High frequency bias power of the second high frequency power supply 64: 13.56 MHz, 0 W
Processing time: 2 seconds
<Conditions for the Process STA2>
Internal pressure of the processing vessel: 200 mTorr (26.66 Pa)
Ar gas flow rate: 200 sccm
High frequency power of the first high frequency power supply 62 (supplied to the upper electrode 30): 60 MHz, 100 W
High frequency bias power of the second high frequency power supply 64: 13.56 MHz, 0 W
Processing time: 10 seconds
<Conditions for the Process STA3>
Internal pressure of the processing vessel: 200 mTorr (26.66 Pa)
O$_2$ gas flow rate: 200 sccm
Ar gas flow rate: 200 sccm
High frequency power of the first high frequency power supply 62 (supplied to the upper electrode 30): 60 MHz, 500 W
High frequency bias power of the second high frequency power supply 64: 13.56 MHz, 0 W
Processing time: 5 seconds
<Conditions for the Process STA4>
Internal pressure of the processing vessel: 200 mTorr (26.66 Pa)
Ar gas flow rate: 1300 sccm
High frequency power of the first high frequency power supply 62 (supplied to the upper electrode 30): 60 MHz, 100 W
High frequency bias power of the second high frequency power supply 64: 13.56 MHz, 0 W
Processing time: 20 seconds Further, in the comparative example 2, processing conditions are set as follows. A sequence in this comparative example 2 is repeated 60 times.
<Conditions for the Process STA1>
Internal pressure of the processing vessel: 200 mTorr (26.66 Pa)
SiCl$_4$ gas flow rate: 20 sccm
Ar gas flow rate: 200 sccm
High frequency power of the first high frequency power supply 62 (supplied to the upper electrode 30): 60 MHz, 100 W
High frequency bias power of the second high frequency power supply 64: 13.56 MHz, 0 W
Processing time: 5 seconds
<Conditions for the Process STA3>
Internal pressure of the processing vessel: 200 mTorr (26.66 Pa)
O$_2$ gas flow rate: 200 sccm
Ar gas flow rate: 200 sccm
High frequency power of the first high frequency power supply 62 (supplied to the upper electrode 30): 60 MHz, 500 W
High frequency bias power of the second high frequency power supply 64: 13.56 MHz, 0 W
Processing time: 5 seconds Then, densities of the silicon oxide films formed in the experimental example 3 and the comparative example 2 are calculated at central positions of the wafers, respectively. Further, the thicknesses of the silicon oxide films formed in the experimental example 3 and the comparative example 2 are also calculated at the central positions of the wafer. As a result, the density of the silicon oxide film formed in the experimental example 3 is 2.65 g/cm$^3$, and the thickness thereof is 22.0 nm. Meanwhile, the density of the silicon oxide film formed in the comparative example 2 is 2.55 g/cm$^3$, and the thickness thereof is 28.6 nm. From these results, it is found out that the silicon oxide film having higher density can be formed in the experimental example 3, as compared to the comparative example 2.

Experimental Examples 4 to 6 and Comparative Example 3

In an experimental example 4, a silicon oxide film is formed on a flat surface of a wafer having a diameter of 300 mm by performing the method MTA. In each of experimental examples 5 and 6, a silicon oxide film is formed on a flat surface of a wafer having a diameter of 300 mm by performing the method MTB. In the process STB4 of the experimental example 5, the flow rate of the Ar gas is set to be 200 sccm, whereas in the process STB4 of the experimental example 6, the flow rate of the Ar gas is set to be 1300 sccm. In the comparative example 3, a silicon oxide film is formed on a flat surface of a wafer having a diameter of 300 mm by performing a method in which the process STA2 and the process STA4 are omitted from the method MTA. Further, in the experimental examples 4 to 6 and the comparative example 3, processing conditions are set such that the silicon oxide films have the approximately same thickness.

Figure 13:
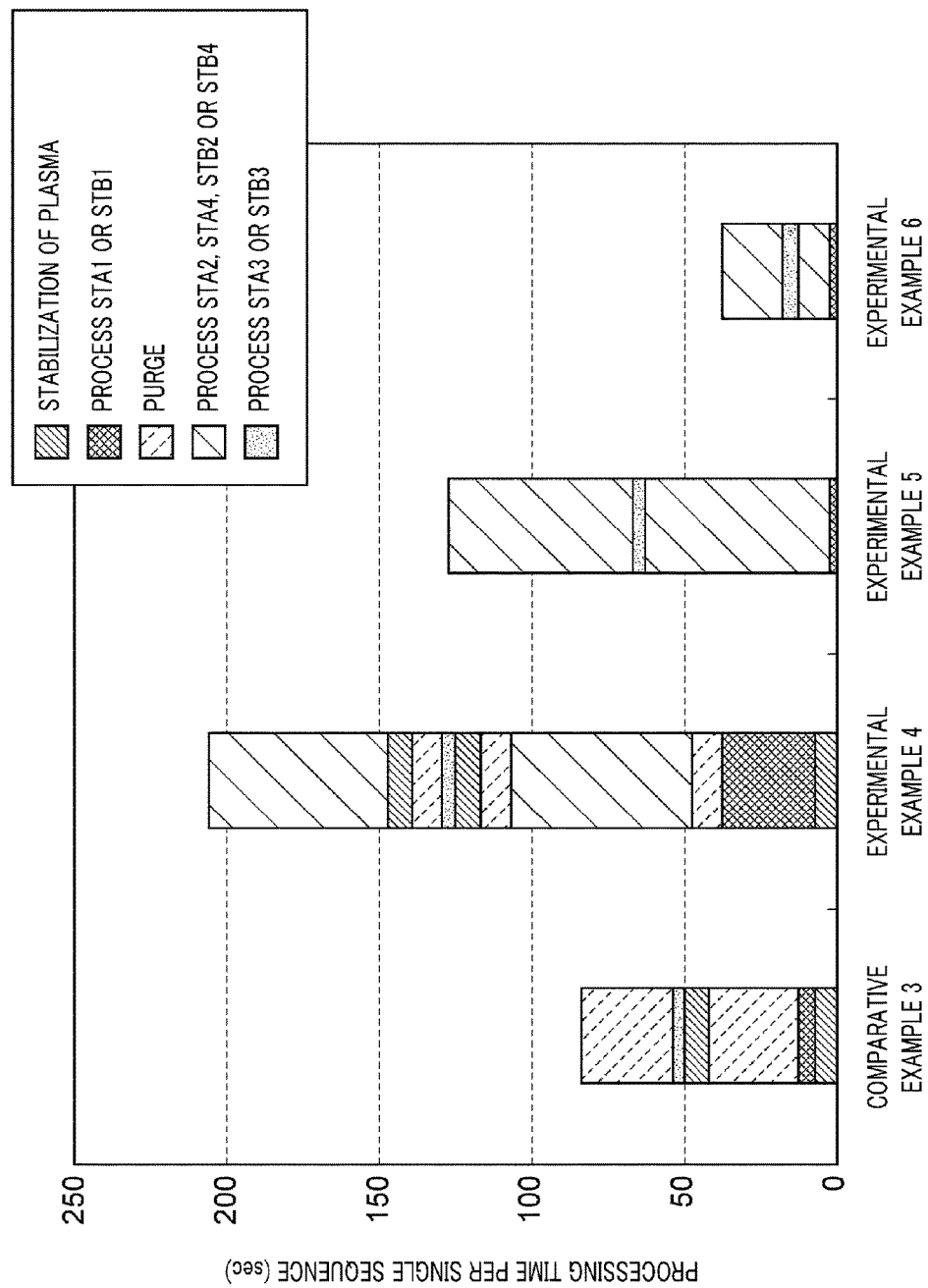
FIG. 13 is a graph showing processing times per a single sequence in experimental examples 4 to 6 and a comparative example 3.

To elaborate, in the experimental example 4, the processing conditions are set as follows. Further, in this experimental example 4, the sequence SQA is repeated 60 times. Moreover, a processing time of each of the processes STP1 to STP4 is set to be 10 seconds. In addition, a time period of 7 seconds is secured for plasma stabilization prior to performing each of the processes STA1 to STA4.
<Conditions for the Process STA1>
Internal pressure of the processing vessel: 200 mTorr (26.66 Pa)
SiCl$_4$ gas flow rate: 3 sccm
Ar gas flow rate: 200 sccm
High frequency power of the first high frequency power supply 62 (supplied to the upper electrode 30): 60 MHz, 100 W
High frequency bias power of the second high frequency power supply 64: 13.56 MHz, 0 W
Processing time: 30 seconds
<Conditions for the Process STA2>
Internal pressure of the processing vessel: 200 mTorr (26.66 Pa)
Ar gas flow rate: 200 sccm
High frequency power of the first high frequency power supply 62 (supplied to the upper electrode 30): 60 MHz, 100 W
High frequency bias power of the second high frequency power supply 64: 13.56 MHz, 0 W
Processing time: 60 seconds
<Conditions for the Process STA3>
Internal pressure of the processing vessel: 200 mTorr (26.66 Pa)
O$_2$ gas flow rate: 200 sccm Ar gas flow rate: 200 sccm
High frequency power of the first high frequency power supply 62 (supplied to the upper electrode 30): 60 MHz, 500 W
High frequency bias power of the second high frequency power supply 64: 13.56 MHz, 0 W
Processing time: 5 seconds
<Conditions for the Process STA4>
Internal pressure of the processing vessel: 200 mTorr (26.66 Pa)
Ar gas flow rate: 200 sccm
High frequency power of the first high frequency power supply 62 (supplied to the upper electrode 30): 60 MHz, 100 W
High frequency bias power of the second high frequency power supply 64: 13.56 MHz, 0 W
Processing time: 60 seconds Further, in the experimental example 5, processing conditions are set as follows. In this experimental example 5, the sequence SQB is repeated 60 times.
<Conditions for the Process STB1>
Internal pressure of the processing vessel: 200 mTorr (26.66 Pa)
SiCl$_4$ gas flow rate: 3 sccm
Ar gas flow rate: 200 sccm
High frequency power of the first high frequency power supply 62 (supplied to the upper electrode 30): 60 MHz, 100 W
High frequency bias power of the second high frequency power supply 64: 13.56 MHz, 0 W
Processing time: 2 seconds
<Conditions for the Process STB2>
Internal pressure of the processing vessel: 200 mTorr (26.66 Pa)
Ar gas flow rate: 200 sccm
High frequency power of the first high frequency power supply 62 (supplied to the upper electrode 30): 60 MHz, 100 W
High frequency bias power of the second high frequency power supply 64: 13.56 MHz, 0 W
Processing time: 60 seconds
<Conditions for the Process STB3>
Internal pressure of the processing vessel: 200 mTorr (26.66 Pa)
O$_2$ gas flow rate: 200 sccm
Ar gas flow rate: 200 sccm
High frequency power of the first high frequency power supply 62 (supplied to the upper electrode 30): 60 MHz, 500 W
High frequency bias power of the second high frequency power supply 64: 13.56 MHz, 0 W
Processing time: 5 seconds
<Conditions for the Process STB4>
Internal pressure of the processing vessel: 200 mTorr (26.66 Pa)
Ar gas flow rate: 200 sccm
High frequency power of the first high frequency power supply 62 (supplied to the upper electrode 30): 60 MHz, 500 W
High frequency bias power of the second high frequency power supply 64: 13.56 MHz, 0 W
Processing time: 60 seconds Further, in the experimental example 6, processing conditions are set as follows. In this experimental example 6, the sequence SQB is repeated 60 times.
<Conditions for the Process STB1>
Internal pressure of the processing vessel: 200 mTorr (26.66 Pa)
SiCl$_4$ gas flow rate: 14 sccm
Ar gas flow rate: 200 sccm
High frequency power of the first high frequency power supply 62 (supplied to the upper electrode 30): 60 MHz, 100 W
High frequency bias power of the second high frequency power supply 64: 13.56 MHz, 0 W
Processing time: 2 seconds
<Conditions for the Process STB2>
Internal pressure of the processing vessel: 200 mTorr (26.66 Pa)
Ar gas flow rate: 200 sccm
High frequency power of the first high frequency power supply 62 (supplied to the upper electrode 30): 60 MHz, 100 W
High frequency bias power of the second high frequency power supply 64: 13.56 MHz, 0 W
Processing time: 10 seconds
<Conditions for the Process STB3>
Internal pressure of the processing vessel: 200 mTorr (26.66 Pa)
O$_2$ gas flow rate: 200 sccm
Ar gas flow rate: 200 sccm
High frequency power of the first high frequency power supply 62 (supplied to the upper electrode 30): 60 MHz, 500 W
High frequency bias power of the second high frequency power supply 64: 13.56 MHz, 0 W
Processing time: 5 seconds
<Conditions for the Process STB4>
Internal pressure of the processing vessel: 200 mTorr (26.66 Pa)
Ar gas flow rate: 1300 sccm
High frequency power of the first high frequency power supply 62 (supplied to the upper electrode 30): 60 MHz, 100 W
High frequency bias power of the second high frequency power supply 64: 13.56 MHz, 0 W
Processing time: 20 seconds Furthermore, in the comparative example 3, processing conditions are set as follows. A sequence in this comparative example 3 is repeated 60 times. Furthermore, in the comparative example 3, a processing time of each of the process STP1 and the process STP3 is set to be 30 seconds. In addition, a time period of 7 seconds is secured for plasma stabilization prior to performing each of the processes STA1 and STA3.
<Conditions for the Process STA1>
Internal pressure of the processing vessel: 200 mTorr (26.66 Pa)
SiCl$_4$ gas flow rate: 3 sccm
Ar gas flow rate: 200 sccm
High frequency power of the first high frequency power supply 62 (supplied to the upper electrode 30): 60 MHz, 100 W
High frequency bias power of the second high frequency power supply 64: 13.56 MHz, 0 W
Processing time: 5 seconds
<Conditions for the Process STA3>
Internal pressure of the processing vessel: 200 mTorr (26.66 Pa)
O$_2$ gas flow rate: 200 sccm
Ar gas flow rate: 200 sccm High frequency power of the first high frequency power supply 62 (supplied to the upper electrode 30): 60 MHz, 500 W High frequency bias power of the second high frequency power supply 64: 13.56 MHz, 0 W Processing time: 5 seconds FIG. 13 provides graphs of processing times per a single sequence in the experimental examples 4 to 6 and the comparative example 3, respectively. As can be seen from FIG. 13, in the experimental example 4 based on the method MTA, a processing time per a single sequence is found to be longer than that in the comparative example 3 because the processes of generating the plasma of the rare gas (processes STA2 and STA4) are included. Meanwhile, in the experimental example 5 based on the method MTB, a processing time per a single sequence is found to be greatly decreased as compared to that in the experimental example 4. Moreover, in the experimental example 6 which is based on the method MTB and in which the rare gas having a high flow rate is supplied in the process STB4, a processing time per a single sequence is found to be greatly decreased as compared to that in the experimental example 5.

Experimental Examples 7 to 11

Figure 14:
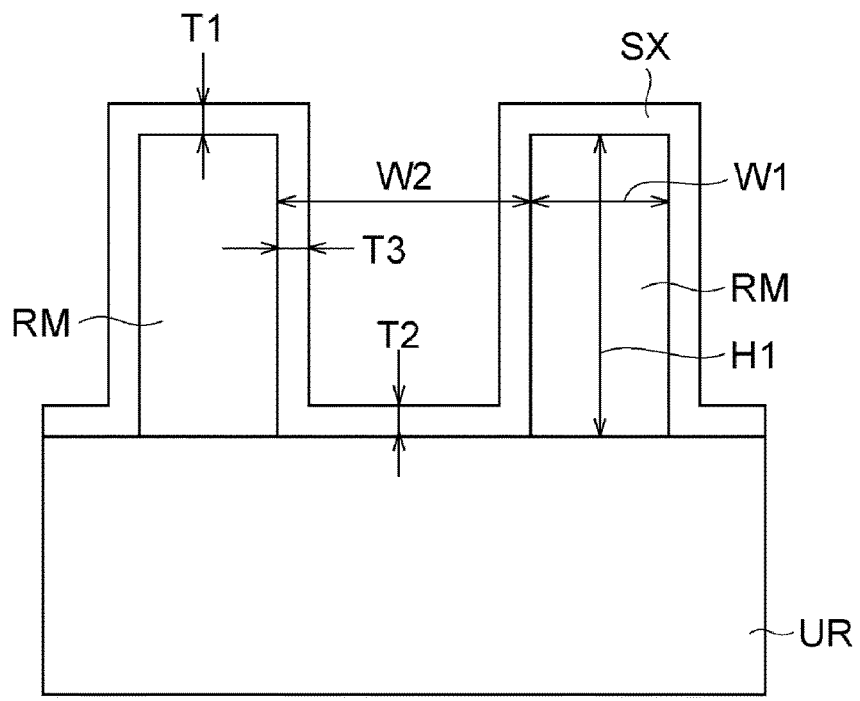
FIG. 14 is a diagram illustrating a wafer used in experimental examples 7 to 11.

In experimental examples 7 to 11, by performing the method MTB, a silicon oxide film SX is formed on a wafer having a resist mask RM on an underlying region UR, as illustrated in FIG. 14. The resist mask RM has a line-and-space pattern having a line width W1 of 45 nm. Further, a line height H1 of the resist mask RM is 90 nm. Furthermore, a ratio between the line width W1 and a space width W2, i.e., a ratio of W1:W2 is set to be 1:1, 1:2, 1:3, 1:4 and 1:5 in the experimental examples 7 to 11, respectively.

In the experimental examples 7 to 11, processing conditions are set as follows. In these experimental examples 7 to 11, the sequence SQB is repeated 60 times.

<Conditions for the Process STB1>

Internal pressure of the processing vessel: 200 mTorr (26.66 Pa)

SiCl$_4$ gas flow rate: 14 sccm

Ar gas flow rate: 200 sccm

High frequency power of the first high frequency power supply 62 (supplied to the upper electrode 30): 60 MHz, 100 W High frequency bias power of the second high frequency power supply 64: 13.56 MHz, 0 W Processing time: 2 seconds <Conditions for the Process STB2>

Internal pressure of the processing vessel: 200 mTorr (26.66 Pa)

Ar gas flow rate: 200 sccm

High frequency power of the first high frequency power supply 62 (supplied to the upper electrode 30): 60 MHz, 100 W High frequency bias power of the second high frequency power supply 64: 13.56 MHz, 0 W Processing time: 10 seconds <Conditions for the Process STB3>

Internal pressure of the processing vessel: 200 mTorr (26.66 Pa)

O$_2$ gas flow rate: 200 sccm

Ar gas flow rate: 200 sccm

High frequency power of the first high frequency power supply 62 (supplied to the upper electrode 30): 60 MHz, 500 W High frequency bias power of the second high frequency power supply 64: 13.56 MHz, 0 W Processing time: 5 seconds <Conditions for the Process STB4>

Internal pressure of the processing vessel: 200 mTorr (26.66 Pa)

Ar gas flow rate: 1300 sccm

High frequency power of the first high frequency power supply 62 (supplied to the upper electrode 30): 60 MHz, 100 W High frequency bias power of the second high frequency power supply 64: 13.56 MHz, 0 W Processing time: 20 seconds Then, a thickness T1 of the silicon oxide film SX formed on a top surface of the resist mask RM, a thickness T2 of the silicon oxide film SX formed on the underlying layer UR and a thickness (width) T3 of the silicon oxide film SX formed on a side surface of the resist mask RM are measured for each of the experimental examples 7 to 11. Further, the thickness T1, the thickness T2 and the thickness T3 are measured at a center and an edge of the wafer, respectively. The results are provided in Table 1.

TABLE 1

|  |  | Experimental Example 7 | Experimental Example 8 | Experimental Example 9 | Experimental Example 10 | Experimental Example 11 |
| --- | --- | --- | --- | --- | --- | --- |
| Center | T1(nm) | 18.2 | 17.5 | 18.3 | 19.0 | 19.0 |
|  | T2(nm) | 15.1 | 17.5 | 18.3 | 18.3 | 19.0 |
|  | T3(nm) | 20.5 | 20.7 | 21.0 | 21.2 | 24.3 |
| Edge | T1(nm) | 19.0 | 18.3 | 18.3 | 18.3 | 19.0 |
|  | T2(nm) | 15.1 | 18.3 | 19.0 | 19.0 | 18.2 |
|  | T3(nm) | 19.3 | 19.8 | 19.9 | 20.1 | 23.3 |

As can be seen from Table 1, in each of the experimental examples 7 to 11, the silicon oxide film SX having the approximately same thickness at both the center and the edge of the wafer is formed regardless of the density of the pattern of the resist mask RM. That is, it is proved that the silicon oxide film SX having high in-plane uniformity is formed regardless of the density of the pattern of the resist mask RM in each of the experimental examples 7 to 11. Furthermore, in each of the experimental examples 7 to 11, differences between the thicknesses T1, T2 and T3 are found to be small at both the center and the edge of the wafer regardless of the density of the pattern of the resist mask RM. That is, it is proved that the silicon oxide film can be formed on the surface of the wafer with conformal coatability even if the wafer has the resist mask RM provided with an opening having a high aspect ratio.

Experimental Example 12

In an experimental example 12, a relationship between the flow rate of the Ar gas supplied in the process STB4 and a time period taken before the emission caused by the oxygen gas supplied in the process STB3 is no more observed is investigated. Specifically, the process STB3 and the process STB4 are performed under the following conditions, and the emission within the processing vessel at the time of performing the process STB4 is observed by the OES. Then, a time period taken before the emission caused by the oxygen gas is no more observed is obtained.

Figure 15:
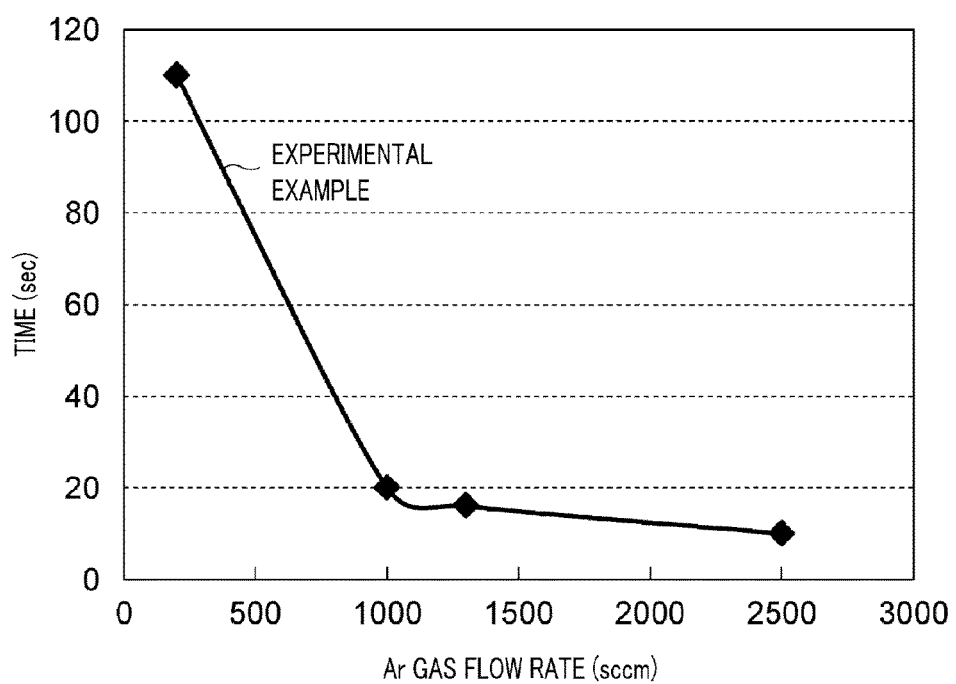
FIG. 15 is a graph showing a result of an experimental example 12.

<Conditions for the Process STB3>
Internal pressure of the processing vessel: 200 mTorr (26.66 Pa)
$O_2$ gas flow rate: 200 sccm
Ar gas flow rate: 200 sccm
High frequency power of the first high frequency power supply 62 (supplied to the upper electrode 30): 60 MHz, 500 W
High frequency bias power of the second high frequency power supply 64: 13.56 MHz, 0 W
Processing time: 5 seconds
<Conditions for the Process STB4>
Internal pressure of the processing vessel: 200 mTorr (26.66 Pa)
Ar gas flow rate: 1300 sccm
High frequency power of the first high frequency power supply 62 (supplied to the upper electrode 30): 60 MHz, 100 W
High frequency bias power of the second high frequency power supply 64: 13.56 MHz, 0 W
Processing time: variable parameter FIG. 15 presents a graph showing the result of the experimental example 12. In FIG. 15, a horizontal axis represents the flow rate of the Ar gas in the process STB4, and a vertical axis represents a time period from a starting time point of the process STB4 to a time point when the emission caused by the oxygen gas is no more observed. That is, the vertical axis indicates a processing time required for the process STB4. As can be seen from FIG. 15, as the flow rate of the Ar gas in the process STB4 increases over 200 sccm, that is, as the flow rate of the Ar gas in the process STB4 becomes higher than the flow rate of the Ar gas in the process STB3, a time period during which the oxygen gas is exhausted in the process STB4, i.e., the processing time required for the process STB4 is reduced. Further, it is also found out that by setting the flow rate of the Ar gas in the process STB4 to be equal to or higher than 1000 sccm, that is, by setting the flow rate of the Ar gas in the process STB4 to be five or more times as high as the flow rate of the Ar gas in the process STB3, the time period during which the oxygen gas is exhausted in the process STB4, i.e., the processing time required for the process STB4 is shortened.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

We claim:
1. A plasma processing method comprising:
forming a silicon oxide film by repeating a sequence including:
a first process of forming a reactant precursor on a processing target object including a mask by generating plasma of a first gas containing a silicon halide gas and plasma of a rare gas within a processing vessel of a plasma processing apparatus;
a second process of generating plasma of a rare gas within the processing vessel after the first process;
a third process of forming a silicon oxide film by generating plasma of a second gas containing oxygen gas and plasma of a rare gas within the processing vessel after the second process; and
a fourth process of generating plasma of a rare gas within the processing vessel after the third process,
wherein the first process, the second process, the third process and the fourth process are performed in order,
the plasma of the rare gas is generated throughout the first process, the second process, the third process and the fourth process, and
a flow rate of the rare gas supplied into the processing vessel in the fourth process is higher than a flow rate of the rare gas supplied into the processing vessel in the third process.
2. The method of claim 1,
wherein the flow rate of the rare gas supplied into the processing vessel in the fourth process is five or more times as high as the flow rate of the rare gas supplied into the processing vessel in the third process.
3. The method of claim 1, further comprising:
purging a space within the processing vessel between the first process and the second process;
purging the space within the processing vessel between the second process and the third process;
purging the space within the processing vessel between the third process and the fourth process;
purging the space within the processing vessel between the fourth process and the first process.
4. The method of claim 1,
wherein the first process is performed under a high-pressure and low-power condition where an internal pressure of the processing vessel is equal to or higher than 13.33 Pa and a power of a high frequency power for plasma generation is equal to or lower than 100 W.
5. The method of claim 1,
wherein a bias power for ion attraction is not applied to a mounting table configured to mount thereon the processing target object in the first process.
6. The method of claim 1,
wherein the silicon halide gas is a $SiCl_4$ gas.
7. The method of claim 1,
wherein the processing target object further includes an etching target layer, an organic film on the etching target layer, and a silicon-containing antireflection film on the organic film,
the mask is a resist mask formed on the antireflection film, and
the method further comprises:
removing, after performing the sequence, a region made of silicon oxide on a surface of the antireflection film by plasma generated within the processing vessel;
etching the antireflection film by plasma generated within the processing vessel; and
etching the organic film by plasma generated within the processing vessel.
8. The method of claim 7,
wherein the plasma processing apparatus is configured as a capacitively coupled plasma processing apparatus, and
the method further comprises, before performing the sequence, irradiating secondary electrons to the mask by generating plasma within the processing vessel and by applying a negative DC voltage to an upper electrode of the plasma processing apparatus.

9. The method of claim 1,
wherein the processing target object further includes an etching target layer and an organic film on the etching target layer,
the mask is formed on the organic film, and
the method further comprises:
etching an antireflection film having thereon a resist mask by plasma generated within the processing vessel to form the mask from the antireflection film; and
etching the organic film by plasma generated within the processing vessel,
wherein the sequence is performed between the etching of the antireflection film and the etching of the organic film, and
the method further comprises removing, after performing the sequence, a region made of silicon oxide on a surface of the organic film by plasma generated within the processing vessel.

10. The method of claim 9,
wherein the plasma processing apparatus is configured as a capacitively coupled plasma processing apparatus, and
the method further comprises, before the etching of the antireflection film, irradiating secondary electrons to the resist mask by generating plasma within the processing vessel and applying a negative DC voltage to an upper electrode of the plasma processing apparatus.

11. The method of claim 9, further comprising:
forming a protective film made of silicon oxide on the processing target object after the etching of the antireflection film and before performing the sequence.

12. The method of claim 11,
wherein the plasma processing apparatus is configured as a capacitively coupled plasma processing apparatus, and
in the forming of the protective film made of the silicon oxide, plasma is generated within the processing vessel and a negative DC voltage is applied to an upper electrode, which is made of silicon, of the plasma processing apparatus.

13. The method of claim 11,
wherein in the forming of the protective film made of the silicon oxide, plasma of a mixed gas containing the silicon halide gas and the oxygen gas is generated within the processing vessel.

14. The method of claim 11,
wherein the plasma processing apparatus is configured as a capacitively coupled plasma processing apparatus, and
in the forming of the protective film made of the silicon oxide, plasma of a mixed gas containing a hydrogen gas and a rare gas is generated by supplying a high frequency power for plasma generation to an upper electrode, which is made of silicon oxide, of the plasma processing apparatus.

* * * * *